United States Patent
Yonehara

(10) Patent No.: US 8,513,093 B2
(45) Date of Patent: Aug. 20, 2013

(54) SUBSTRATE STRUCTURE INCLUDING FUNCTIONAL REGION AND METHOD FOR TRANSFERRING FUNCTIONAL REGION

(75) Inventor: Takao Yonehara, Sunnyvale, CA (US)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 13/395,202

(22) PCT Filed: Sep. 14, 2010

(86) PCT No.: PCT/JP2010/005598
§ 371 (c)(1),
(2), (4) Date: Mar. 9, 2012

(87) PCT Pub. No.: WO2011/033758
PCT Pub. Date: Mar. 24, 2011

(65) Prior Publication Data
US 2012/0171866 A1    Jul. 5, 2012

(30) Foreign Application Priority Data
Sep. 15, 2009 (JP) .................................. 2009-213132

(51) Int. Cl.
*H01L 21/30*    (2006.01)
*H01L 21/00*    (2006.01)

(52) U.S. Cl.
USPC .................... 438/458; 438/455; 257/E21.001

(58) Field of Classification Search
USPC ...................... 438/22–48, 455–465
See application file for complete search history.

(56) References Cited

U.S. PATENT DOCUMENTS

| 5,466,631 A * | 11/1995 | Ichikawa et al. ............. 438/406 |
| 6,214,733 B1 | 4/2001 | Sickmiller |
| 6,274,518 B1 * | 8/2001 | Yuri et al. ..................... 438/791 |
| 6,440,822 B1 * | 8/2002 | Hayama et al. ............... 438/462 |
| 6,613,610 B2 * | 9/2003 | Iwafuchi et al. ............. 438/128 |
| 6,913,985 B2 | 7/2005 | Ogihara |
| 7,910,389 B2 * | 3/2011 | Kim et al. ...................... 438/48 |
| 7,943,488 B2 * | 5/2011 | Yonehara ...................... 438/458 |
| 7,960,195 B2 * | 6/2011 | Maeda et al. ................... 438/29 |
| 7,998,834 B2 * | 8/2011 | Kim et al. ..................... 438/455 |
| 8,012,856 B2 * | 9/2011 | von Malm .................... 438/460 |
| 8,076,168 B2 * | 12/2011 | Saeki .............................. 438/46 |
| 8,237,761 B2 * | 8/2012 | Yonehara et al. ............. 347/238 |
| 2003/0011738 A1 | 1/2003 | Akiyama |
| 2003/0162463 A1 | 8/2003 | Hayashi |

(Continued)

FOREIGN PATENT DOCUMENTS

| DE | 10-2007-043877 A1 | 1/2009 |
| EP | 2182552 A2 | 5/2010 |

(Continued)

*Primary Examiner* — Scott B Geyer
*Assistant Examiner* — Evren Seven
(74) *Attorney, Agent, or Firm* — Canon U.S.A., Inc. IP Division

(57) ABSTRACT

According to a method for transferring a functional region, at least part of functional regions on separation layers arranged on a first substrate is transferred onto a second substrate, the separation layers being capable of being brought into a separable state by treatment. In a first bonding step, the first substrate is bonded to the second substrate with a dry film resist arranged between the second substrate and the at least part of the functional regions above the first substrate. In an exposure step, at least part of the dry film resist is exposed. In a patterning step, the exposed dry film resist is patterned.

4 Claims, 19 Drawing Sheets

(56) References Cited

U.S. PATENT DOCUMENTS

2004/0201789 A1  10/2004  Akiyama
2005/0148121 A1   7/2005  Yamazaki
2007/0243662 A1*  10/2007  Johnson et al. ............... 438/106
2009/0315965 A1* 12/2009  Yamagata et al. ............ 347/130

FOREIGN PATENT DOCUMENTS

| | | |
|---|---|---|
| JP | 62-026874 A | 2/1987 |
| JP | 11-142878 A | 5/1999 |
| JP | 2003-174041 A | 6/2003 |
| JP | 2006-053171 A | 2/2006 |
| WO | 03/081664 A2 | 10/2003 |
| WO | 2006/055601 A2 | 5/2006 |
| WO | 2006/083104 A1 | 8/2006 |
| WO | 2008/050901 A1 | 5/2008 |
| WO | 2008/053907 A1 | 5/2008 |
| WO | 2010/100882 A1 | 9/2010 |

* cited by examiner

UNEXPOSED OR WEAKLY
EXPOSED PORTION
1 MICROMETER OR LESS THICK

US 8,513,093 B2

SUBSTRATE STRUCTURE INCLUDING FUNCTIONAL REGION AND METHOD FOR TRANSFERRING FUNCTIONAL REGION

TECHNICAL FIELD

The present invention relates to a method for transferring a functional region to produce a semiconductor member, a semiconductor product, a semiconductor element, and so forth, and relates to a substrate structure including a functional region separated into a plurality of subregions. LED arrays, LED-printer heads, LED printers, and so forth may be produced by the method for transferring a functional region and using the substrate structure according to aspects of the present invention.

BACKGROUND ART

Hitherto, a technique has been known in which layers constituting a light-emitting diode formed on a GaAs substrate with a sacrificial layer are transferred onto a silicon substrate. PTL 1 discloses a technique for transferring layers constituting light-emitting diodes onto a silicon substrate. Specifically, for the layers, constituting light-emitting diodes, formed on a GaAs substrate with a sacrificial layer, grooves configured to separate the layers are formed in accordance with light-emitting regions. The sacrificial layer is exposed directly below the grooves. A dry film resist is bonded to the layers constituting light-emitting diodes. Furthermore, a meshed supporting member formed of metal wire is bonded to the dry film resist. A portion of the resist other than a portion of the resist located directly below the metal wire is removed. The sacrificial layer is etched by being brought into contact with an etching solution with the meshed supporting member, thereby separating the GaAs substrate from the resulting bonded structure. After the separation of the GaAs substrate, the layers constituting light-emitting diodes are bonded to a silicon substrate. Thereby, the layers constituting light-emitting diodes are transferred onto the silicon substrate.

PTL 2 discloses a technique in which at least one selected from a plurality of semi-conductor chips arranged on a substrate is mounted on another substrate. Specifically, a first laminate having a device layer including an element is prepared on a first substrate. A second laminate having a separation layer is prepared on a second substrate. The first laminate is bonded to the second laminate in such a manner that the device layer faces the separation layer. The resulting laminate including the device layer and the separation layer is separated in a predetermined pattern, thereby forming a plurality of chips including the element on the second substrate. A predetermined chip selected from the chips is bonded to a third substrate at a predetermined position of the third substrate. The second substrate is separated from the predetermined chip at the separation layer, thereby mounting the predetermined chip on the third substrate.

CITATION LIST

Patent Literature

PTL 1: U.S. Pat. No. 6,913,985
PTL 2: Japanese Patent Laid-Open No. 2003-174041

SUMMARY OF INVENTION

Technical Problem

In the case of producing, for example, an LED array including luminous layers composed of a compound semiconductor, such as GaAs, on a GaAs substrate, since the GaAs substrate is very expensive compared with a silicon substrate, the GaAs substrate is required to be effectively used. Furthermore, in the case where the size of the GaAs substrate (e.g., 2-, 4-, or 6-inch substrate) is different from the size of the silicon substrate (e.g., 4-, 5-, 6-, 8-, 12-, or 16-inch substrate), when the entirety of the substrate is transferred in one operation, a region onto which the LED array can be transferred is a region of a smaller substrate. To efficiently perform the transfer, thus, both substrates are limited by requiring the same size equal to the size of a smaller substrate.

In the case where transfer as disclosed in PTL 1 is performed, only portions of the
GaAs semiconductor substrate corresponding to elements formed on the destination silicon substrate are effectively usable. An element-free portion of the GaAs semi-conductor substrate located between the elements is not used and is discarded. This problem will be further described with reference to the drawings. FIG. 22A illustrates circuit elements formed on a silicon substrate. FIG. 22B illustrates luminous layers formed on a GaAs substrate. In FIGS. 22A and 22B, reference numeral 11 denotes the GaAs substrate, reference numeral 12 denotes the luminous layers including GaAs, reference numeral 13 denotes the silicon substrate, and reference numeral 14 denotes the circuit elements formed on the silicon substrate. The transfer of the luminous layers 12 onto the circuit elements 14 leads to the completion of light-emitting elements. Each of the luminous layers 12 is arranged on part of a corresponding one of the circuit elements 14 or is arranged adjacent to a corresponding one of the circuit elements. For example, each luminous layer 12 has a size of about 10 mm*50 micrometers. Meanwhile, for example, each circuit element 14 has a size of about 10 mm*300 micrometers. Thus, in the case where the luminous layers 12 are transferred onto the circuit elements 14 in one operation, the arrangement of the luminous layers 12 and the number of the luminous layers 12 per substrate are limited to the arrangement of the circuit elements 14. Thus, the area per unit area of portions used as the luminous layers 12 on the GaAs substrate 11 is small.

Meanwhile, PTL 2 discloses a technique for forming many chips on one substrate and selectively mounting part of the chips. According to this technique, the plural chips to be transferred are formed on a seed substrate (source substrate). It is thus possible to effectively use the substrate to a certain extent. However, according to the technique disclosed in PTL 2, when the chips are selectively mounted, an adhesive is applied to the chips to be mounted. This can cause the following problems: When the size of the chips is reduced to, for example, several hundreds of micrometers or less in length or width, the adhesive can flow out of the chip to be mounted. If the adhesive flows out, a chip that will not be mounted can be bonded. This can lead to defective mounting, thereby reducing the yield. Thus, there is a demand for a method for achieving more effectively use of a substrate. Furthermore, a reduction in the size of chips requires a reduction in the thickness of adhesive layers in order not to allow the adhesive to flow out of the chips. In this case, when the bonding is performed, chips that will not be mounted can be broken by coming into contact with a mounting substrate during the bonding.

In light of the foregoing problems, according to one aspect of the present invention, a method for transferring at least part of a functional region on a separation layer arranged on a first substrate onto a second substrate, the separation layer being capable of being brought into a separable state by treatment, includes a first bonding step of bonding the first substrate to the second substrate with a dry film resist arranged between the second substrate and the at least part of the functional region above the first substrate, an exposure step of exposing at least part of the dry film resist, and a patterning step of patterning the exposed dry film resist by development.

According to another aspect of the present invention, a method for transferring at least part of a functional region on a separation layer arranged on a first substrate onto a second substrate, the separation layer being capable of being brought into a separable state by treatment, includes a step of arranging a resist on the functional region above the first substrate and subjecting at least part of the resist to exposure and patterning, a step of patterning the functional region by etching using the patterned resist as a mask, and a first bonding step of bonding the first substrate to the second substrate with the resist used as a mask provided therebetween.

According to another aspect of the present invention, a substrate structure includes a first substrate provided with a separation layer, the separation layer being capable of being brought into a separable state by treatment, a functional region arranged on the separation layer, a dry film resist; and a second substrate, in which the first substrate is bonded to the second substrate with the dry film resist provided between at least part of the functional region and the second substrate. Alternatively, a substrate structure includes a functional region, a substrate, and a dry film resist, in which the functional region is bonded to the substrate with the dry film resist provided between at least part of the functional region and the substrate.

According to another aspect of the present invention, a substrate structure includes a first substrate provided with a separation layer, the separation layer being capable of being brought into a separable state by treatment, a functional region arranged on the separation layer, a resist, and a second substrate, the first substrate being bonded to the second substrate with the resist provided between at least part of the functional region and the second substrate. Alternatively, a substrate structure includes a functional region, a substrate, and a resist, in which the functional region is bonded to the substrate with the resist provided between at least part of the functional region and the substrate. The resist is arranged on the functional region above the first substrate, and at least part of the resin is exposed, patterned, and used as a mask when the functional region is patterned by etching.

Advantageous Effects of Invention

According to aspects of the present invention, any region of the functional regions arranged on the substrate may be selectively and efficiently transferred onto another substrate using one or both of a liquid or coating resist and the non-liquid dry film resist (also referred to as "DFR") having photosensitivity, separability induced by appropriate treatment, appropriate tackiness, and adhesiveness. Furthermore, for example, a high-performance LED printer can be produced at low cost using the substrate structure and the method for transferring a functional region according to aspects of the present invention.

DESCRIPTION OF EMBODIMENTS

Figure 1A:
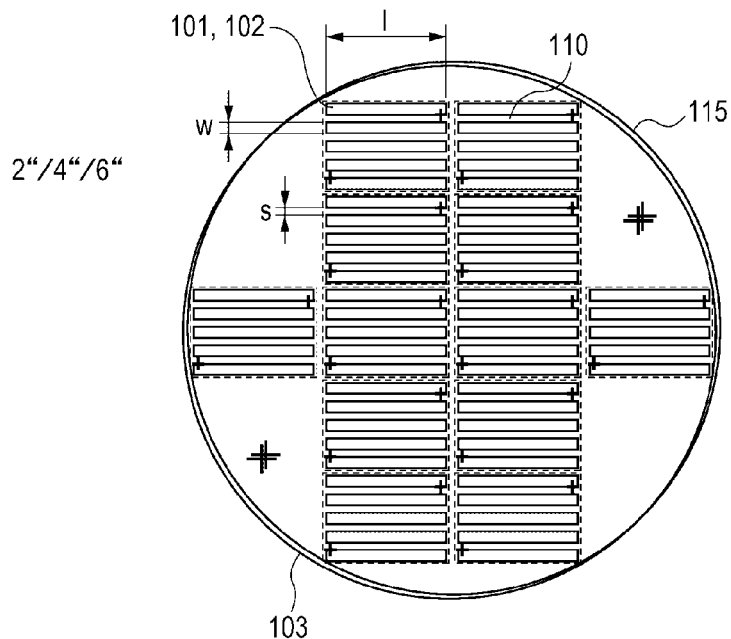
FIG. 1A is a plan view illustrating a step of bonding a first substrate to a DFR according to a first embodiment.

Embodiments of the present invention will be described below. The important points of aspects of the present invention are the bonding and separation of two substrates with a dry film resist (hereinafter, referred to as a "DFR") or a liquid or coating resist (hereinafter, simply referred to as a "resist") using properties of the DFR or the resist. For example, in the case where a functional region is required to be separated in order to selectively transfer the region to another substrate, a portion where the DFR or the resist is needed to be arranged is subjected to energy irradiation such as ultraviolet irradiation to increase the separability of a corresponding portion of the DFR or the resist, thereby selectively separating the functional region. The DFR (readily available examples include FP415 (trade name, manufactured by Tokyo Ohka Kogyo Co., Ltd.)) or the resist has the following properties: for example, photosensitivity, which is used during exposure and patterning; separability attributed to changes in surface roughness, volume (including foaming), and adhesion, decomposition, and so forth by appropriate energy irradiation; appropriate tackiness or adhesiveness needed to bond with another portion; the tackiness of an exposed portion or an unexposed or weakly exposed portion; and resistance to a predetermined treatment solution (the resistance varies depending on whether the resist is negative or positive). In aspects of the present invention, the term "tackiness" refers to adhesiveness (instantaneous adhesiveness) between the DFR and a bonding target, for example, a functional region or a substrate. On the basis of the foregoing concept, essential forms of a substrate structure including a functional region and a method for transferring a functional region according to aspects of the present invention have the configuration described above.

The following embodiments may be made on the basis of the essential forms. For example, in the first bonding step, after a DFR is arranged on at least part of a functional region arranged on a first substrate, the exposure step and the patterning step of patterning the exposed region by development are performed, and then the patterned DFR is bonded to a second substrate. Furthermore, in the first bonding step, the DFR is arranged on at least part of the functional region on a first substrate. The second substrate having transparency is arranged on the DFR, so that these components are bonded to produce a bonded article (structure) including the first substrate, the functional region, the DFR, and the second substrate. Then the exposure step is performed through the second substrate (from the second substrate side), thereby performing the patterning step (see a second embodiment described below). In addition, in the first substrate, treatment in the patterning step can cause a reduction in the tackiness of the DFR; hence, the bonding may be performed as follows: After the DFR is arranged on at least part of the functional region arranged on the first substrate, the exposure step is performed. At this stage, development and patterning are not performed. The DFR is bonded to the second substrate. After the bonding, the patterning step is performed by developing the exposed portion of the DFR (see a first embodiment described below). Moreover, in the first bonding step, after a first DFR (first dry film resist) is arranged on at least part of the functional region arranged on the first substrate, the exposure step and the patterning step are performed. A second DFR (second dry film resist), which is different from the first DFR, and the second substrate are bonded on the patterned first DFR. Then the second DFR is subjected to the exposure step and the patterning step through the second substrate. (see a third embodiment described below). Furthermore, in the patterning step, separation grooves or separation holes are formed through the first substrate or the second substrate, and then a developing solution is fed through the separation grooves or the separation holes (see, for example, the first embodiment described below).

Moreover, in the first bonding step, after the DFR is arranged on at least part of the functional region arranged on the first substrate, the first DFR is subjected to the exposure step and the patterning step. After the second DFR is bonded to the second substrate, the second DFR is subjected to the exposure step and the patterning step. The patterned first DFR is bonded to the patterned second DFR to bond the first substrate to the second substrate (see a fourth embodiment described below).

In addition, the method may further include after a groove formation step of forming separation grooves or separation holes through the first substrate or the second substrate, a first separation step of separating the first substrate from the second substrate at the separation layer by feeding a developing solution through the separation grooves or the separation hole (see the first embodiment described below). Moreover, the method may further include after the first separation step, a second bonding step of bonding at least part of the functional region transferred to the second substrate to a transfer region of a third substrate; and a second separation step of separating the second substrate from the third substrate at a predetermined portion of the DFR or the resist by irradiating the predetermined portion of the DFR or the resist with light having a predetermined wavelength (e.g., ultraviolet rays) from the second substrate side (see, for example, the first embodiment).

Furthermore, the second substrate may be separated into substrate segments (normalized unit substrates) with a desired size. In the first bonding step, the plural substrate segments may be arranged on the DFR or the resist so as to be separated from each other. In this case, gaps are present between the substrate segments. Hence, the formation of the separation grooves or the separation holes may be omitted.

Figure 2B:
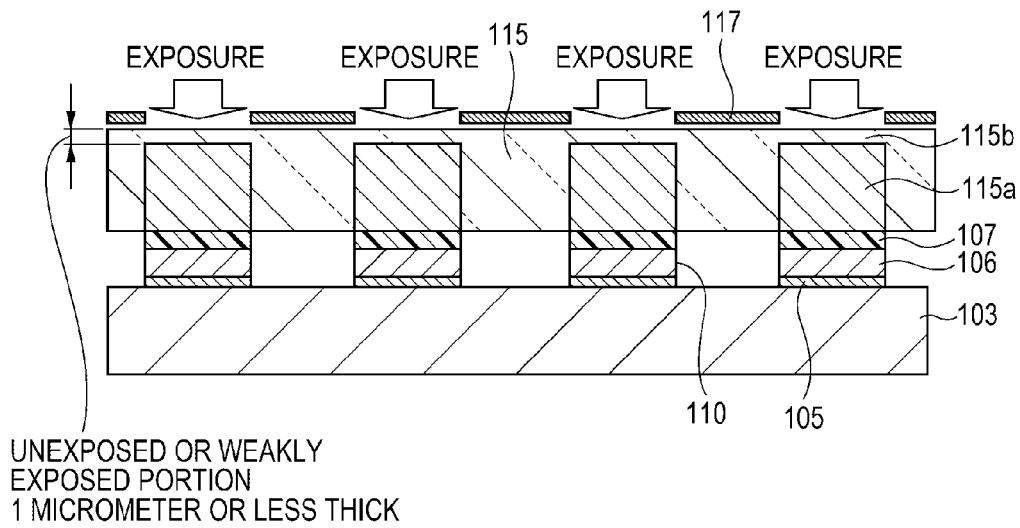
FIG. 2B is a cross-sectional view illustrating the steps of exposing the DFR and bonding the second substrate according to the first embodiment.
Figure 3A:
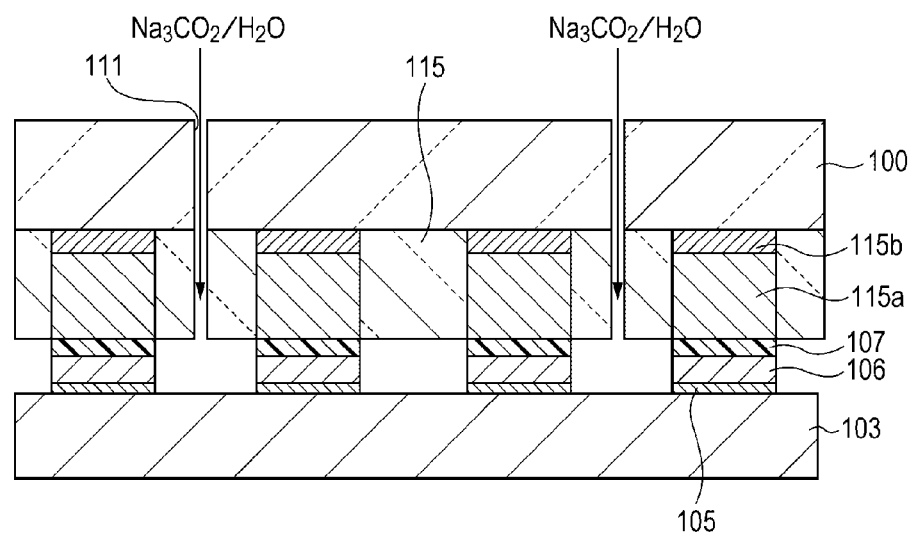
FIG. 3A is a cross-sectional view illustrating a step of patterning the DFR by development according to the first embodiment.
Figure 3B:
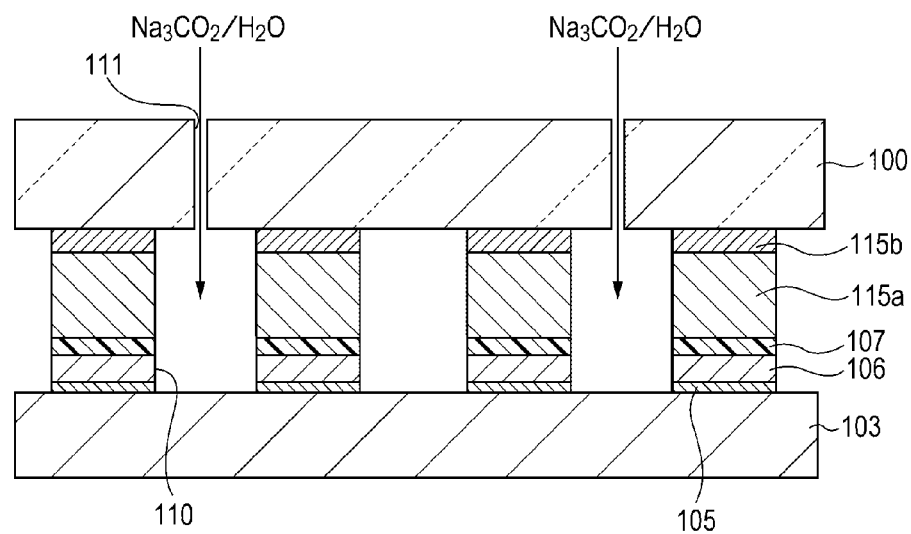
FIG. 3B is a cross-sectional view illustrating the step of patterning the DFR by development according to the first embodiment.

In the substrate structure including the functional region, the DFR may be formed of a single layer and may be in an unexposed state (see FIG. 7C), a partially exposed state corresponding to the pattern of the functional region (see, for example, FIG. 2B), or a state in which the DFR is partially exposed and patterned in accordance with the pattern of the functional region (see, for example, FIG. 3B). Such a substrate structure may be placed on the market as a product configured to selectively transfer a functional region. Alternatively, the DFR may be formed of a plurality of layers and may be in a state in which each of the layers is partially exposed and patterned in response to the pattern of the functional region (see FIG. 18), in a state in which at least one layer (e.g., a surface layer) is not exposed (see FIG. 14A), or in a state in which at least one layer is partially exposed in accordance with the pattern of the functional region (see FIG. 14B). Such a substrate structure may also be placed on the market as a product configured to selectively transfer a functional region.

The tackiness and adhesiveness of the DFR vary in response to exposure, heating, exposure of the surface layer to an oxygen atmosphere, and surface properties of a bonding substrate (for example, surface roughness). According to aspects of the present invention, it is possible to adjust bondability, e.g., tackiness or adhesiveness, between the DFR and a bonding target using techniques described below. To improve the bondability between the DFR and a substrate, a first technique includes applying a resist on a side of the substrate and bonding the DFR to the substrate. This is a technique for increasing the bondability between the DFR and an inorganic substance, e.g., glass, silicon, or a compound semiconductor, by arranging a specific organic substance on a bonding surface (adhesive surface). The substrate surface composed of an inorganic substance has superior bondability with a liquid or coating resist to bondability with the DFR. The bonding between the coating resist and the DFR is the bonding between organic polymer materials, which is strong even at a low temperature. Thus, for example, a bonded article (structure) is completed by applying the resist on the functional region and then bonding the DFR to the resist rather than the direct application of the DFR on the functional region.

A second technique is a technique for increasing the bondability with the DFR by processing the surface of the inorganic substance so as to achieve a predetermined surface roughness. In the case where the surface of the inorganic substance is processed so as to have a surface roughness in a predetermined range, for example, the bondability is improved when the inorganic substance is thermally bonded to the DFR under pressure. Specifically, surfaces of a substrate composed of an inorganic substance and the functional region may be subjected to surface treatment, e.g., polishing or chemical etching, so as to have a surface roughness in a predetermined range. According to our findings, an excessively small surface roughness of the bonding surface leads to a small improvement in bondability. At an excessively large surface roughness, if a transparent substrate is used, for example, fogging of the substrate occurs. Thus, for example, ranges of the surface roughness are as follows: $R_{pv}$ (the maximum difference between the peak and the valley of surface roughness) is in the range of 3 nm to 10 nm; and $R_a$ (the mean difference between the peak and the valley of surface roughness) is in the range of 0.3 nm to 3 nm. The reason for this may be as follows: Unlike a resist, the DFR is not a liquid but has a certain hardness (elasticity). Thus, the formation of an uneven bonding surface increases the area of the bonding surface, improving the bondability.

A third technique is a technique in which after the first DFR is attached to (or brought into contact with) an inorganic substance, a predetermined heat treatment is performed to bond them, and then the first DFR is bonded to the second DFR. Typically, the DFR has a structure like a kind of double-sided adhesive tape. That is, the DFR has a sandwich structure in which each of the surfaces of a DFR film is covered with a polyethylene terephthalate (PET) film. In the case where the DFR is attached to the bonding surface composed of the inorganic substance, one PET film is peeled from the DFR to expose the DFR, and then the exposed DFR surface is attached to the bonding surface. After the surface of the DFR exposed by peeling the PET film is attached to the functional region arranged on the first substrate with the separation layer, heat treatment is performed under a predetermined pressure so as to press-bond the DFR to the first substrate, so that they are bonded so as to achieve a certain degree of bonding strength. This heat treatment probably allows a solvent in the DFR to evaporate, thereby improving the bondability. Peeling the other PET film, which is disposed on a side of the DFR opposite the side adjacent to the bonding surface for the functional region, during the heat treatment facilitates the evaporation of the solvent in the DFR from the surface of the DFR exposed by peeling the other PET film, thus increasing the bonding strength in a shorter time. Meanwhile, in the case where a patterning step is performed by exposing and development (here, the functional region may be etched and patterned using a patterned DFR as a mask) after the step of bonding the DFR to the functional region, the tackiness of the surface of the DFR is reduced. Thus, the bondability between the exposed surface of the DFR opposite the side adjacent to the bonding surface and an inorganic substance, e.g., a second substrate composed of an inorganic substance, is reduced after the patterning step. So, only one PET film disposed on a second DFR, which is an untreated DFR different from the first DFR, to be attached to a surface of the second substrate is peeled to expose only one surface of the second DFR film. The exposed surface of the second DFR is attached to the second substrate, and then heat treatment is performed under a predetermined pressure to firmly bond them together. Next, the other PET film disposed on a side of the second DFR opposite the side adjacent to the bonding surface of the second substrate is peeled without patterning to expose the DFR. The exposed second DFR is bonded to the patterned first DFR on the first substrate. In the case where the bonding is formed as described above, since the first DFR and the second DFR are composed of the same material with a high affinity, it is possible to firmly bond them together even at a low temperature owing to the same chemical properties. In the third technique, the second substrate and the second DFR may be bonded together in advance as described above. Alternatively, the second DFR may first be bonded to the first DFR, and then the second DFR may be bonded to the second substrate.

In aspects of the present invention, a pressure and a heat-treatment temperature (heating temperature) applied in bonding the DFR and the inorganic substance are in the following ranges. An excessively low pressure may lead to insufficient bonding strength (adhesive strength). An excessively high pressure may cause the resist to collapse, thereby changing the shape of the pattern. Alternatively, an excessively high pressure may cause the substrate and the functional region to deform or break. Thus, the pressure is preferably in the range of $5.0 \text{ g/mm}^2$ to $60 \text{ g/mm}^2$ and more preferably $5.0 \text{ g/mm}^2$ to $50 \text{ g/mm}^2$. An excessively low temperature during the heat treatment may lead to an insufficient progress of a bonding reaction or may lead to an increase in bonding time. An excessively high temperature may alter the quality of an organic substance. Thus, the heating temperature is in the range of, for example, 50 degrees (Celsius) to 200 degrees (Celsius). The treatment time may be minimized so long as a sufficient bonding is obtained, from the viewpoint of achieving good productivity. According to out findings, the treatment time is in the range of, for example, 10 seconds to 10 minutes. In each of the second and third techniques, it is possible to bond the first substrate to the second substrate with only the DFR without using a liquid or coating resist, which is advantageous in the number of components, the number of steps, and the production time.

In aspects of the present invention, the term "functional region" is typically used to indicate a region which includes at least a semiconductor junction and which may be an element. Furthermore, the term "functional region" refers to a region which can be used as a functional element, which has piezoelectric properties, dielectric properties, magnetic properties, or the like, which has an electric or magnetic function, and which may be a semiconductor element. In any case, the important point in aspects of the present invention is that when at least part of the functional region is selectively transferred from a substrate including the functional region to a predetermined portion of another substrate, treatment is performed using characteristics of the DFR, the resist, or the like. Typically, a connecting layer described below is arranged. The connecting layer may have a sufficiently large thickness that prevents a portion of the functional region, which should not be transferred, from coming into strong contact with another substrate described above to bond the portion to another substrate described above. Furthermore, the connecting layer may have a sufficiently large thickness to the extent that the connecting layer surely serves its intended function. However, in the case where a connection using a thin metal film is needed in order to electrically connect an element to be transferred to an element or a circuit separately arranged in a destination substrate, it is necessary to reduce the step height of the end face of the connecting layer to prevent disconnection of the thin metal film due to the step height. Moreover, the surface roughness of a portion other than a portion where the connecting layer is arranged may be larger than that of the connecting layer. In this case, if the surface of a semiconductor connection region to be transferred comes into contact with a portion other than the connecting layer, a small number of contact points due to the surface roughness results in weak interatomic forces and intermolecular forces (Van der Waals forces). Unlike the case of the bonding between the DFR, which is an organic substance, and the bonding surface composed of an inorganic substance as described above, in this case, this problem is attributed to the bondability between extremely smooth surfaces of inorganic substances. Thus, as described above, one surface is processed so as to have a predetermined roughness, thereby avoiding the unexpected bonding of the portion other than the connecting layer. Hence, even if accidental contact of the portion other than the connecting layer occurs in the bonding surface, a sufficient bonding strength is not obtained, thus failing to form the bonding. In addition, the connecting layer is patterned using a tacky organic insulating layer or the like. For a region that is not allowed to be accidentally bonded, the tack-free surface of an inorganic substance is exposed. This enables selective bonding of only a region that is intended to be bonded.

Embodiments of the present invention will be described below with reference to the drawings.

First Embodiment

A first embodiment will be described. First, a method for preparing a first substrate including a functional region will be described. As illustrated in FIG. 1B, in this embodiment, first and second functional regions 101 and 102, which will be transferred from a compound semiconductor substrate 103 serving a first substrate to a second substrate 100, include compound semiconductor films 106. As illustrated in FIG. 1B, the first and second functional regions 101 and 102 are formed on the compound semiconductor substrate 103 and include etching sacrificial layers 105 and the compound semiconductor films 106 arranged in that order from the compound semiconductor substrate 103 side. To form this structure, a resist 107 is applied on a film to be formed into the etching sacrificial layers 105 (separation layers capable of being brought into a separable state by treatment) and a film to be formed into the compound semiconductor films 106 on the compound semiconductor substrate 103, exposed, and developed. The film to be formed into the etching sacrificial layers 105 and the film to be formed into the compound semiconductor films 106 are patterned by etching through the resulting mask, thereby forming a groove 110 between the first and second functional regions 101 and 102. In this way, the first and second functional regions 101 and 102 are separated into islands. In this embodiment, the compound semiconductor substrate 103 is a GaAs substrate. GaAs is etched by deep reactive ion etching (RIE) and/or with an etching solution of $NH_4OH+H_2O_2$. Each of the compound semiconductor films 106 in a corresponding one of the first and second functional regions 101 and 102 includes a DBR layer and an LED layer. The etching sacrificial layers 105 are, for example, AlAs layers.

Figure 1B:
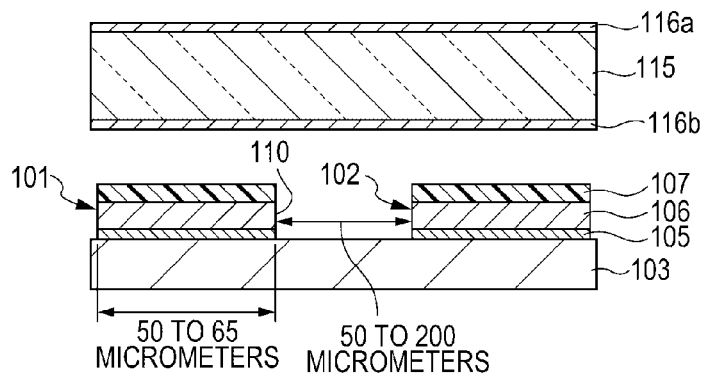
FIG. 1B is a cross-sectional view illustrating the step of bonding the first substrate to the DFR according to the first embodiment.
Figure 1C:
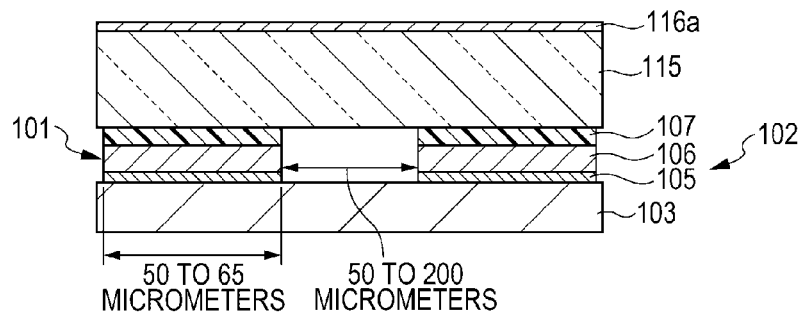
FIG. 1C is a cross-sectional view illustrating the step of bonding the first substrate to the DFR according to the first embodiment.

Next, as illustrated in FIGS. 1A and 1C, a DFR 115 is arranged on at least part of the functional regions formed on the compound semiconductor substrate 103. In this case, a PET film 116b configured to protect the lower surface of the DFR 115 is peeled, and then the DFR 115 is bonded to the patterned first substrate 103 by hot-pressing at, for example, 80 degrees (Celsius).

Examples of the compound semiconductor substrate 103 serving as a seed substrate that can be used include a GaAs substrate, a p-type GaAs substrate, an n-type GaAs substrate, an InP substrate, a SiC substrate, and a GaN substrate. In addition to such a compound semiconductor substrate, a sapphire substrate or a Ge substrate may also be used. The term "etching sacrificial layer" refers to a layer that is selectively etched at an etch rate higher than the etch rate of the compound semiconductor multilayer film. As described above, in this embodiment, the etching sacrificial layers are AlAs layers or AlGaAs layers (e.g., $Al_{0.7}Ga_{0.3}As$). In the case where the AlGaAs layers have a composition of $$Al_xGa_{x-1}As\ (1 \geq x \geq 0.7),\qquad\qquad[\text{Math.1}]$$

an x of 0.7 or more results in significant etch selectivity. In the case where the AlAs layers are used as the etching sacrificial layers, 2% to 10% HF solution may be used as an etching solution.

In the case where a sapphire substrate is used as the compound semiconductor substrate 103, metal nitride films composed of, for example, chromium nitride (CrN) may be used as the etching sacrificial layers on the substrate. In this case, a functional multilayer film configured to produce a blue- or ultraviolet-light-emitting device, e.g., LED or laser, may be deposited on chromium nitride by epitaxial growth. In this multilayer film, an active layer may be composed of GaInN, and a spacer layer may be composed of AlGaN or GaN. As an etchant for the metal nitride films, serving as the sacrificial layers, composed of, for example, chromium nitride (CrN), a common Cr etchant, e.g., a chromium etching solution, may be used.

Figure 2A:
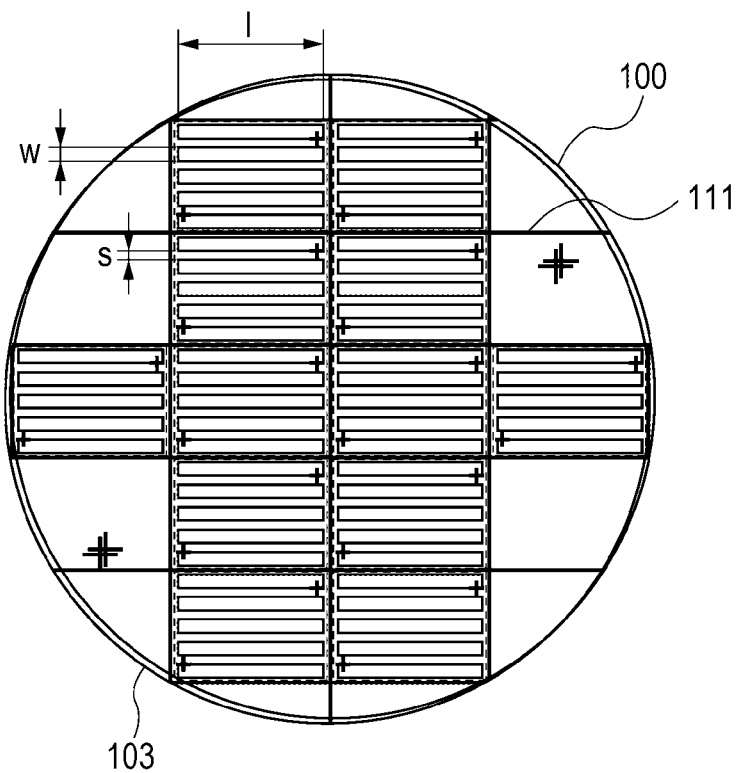
FIG. 2A is a plan view illustrating the steps of exposing the DFR and bonding a second substrate according to the first embodiment.
Figure 2C:
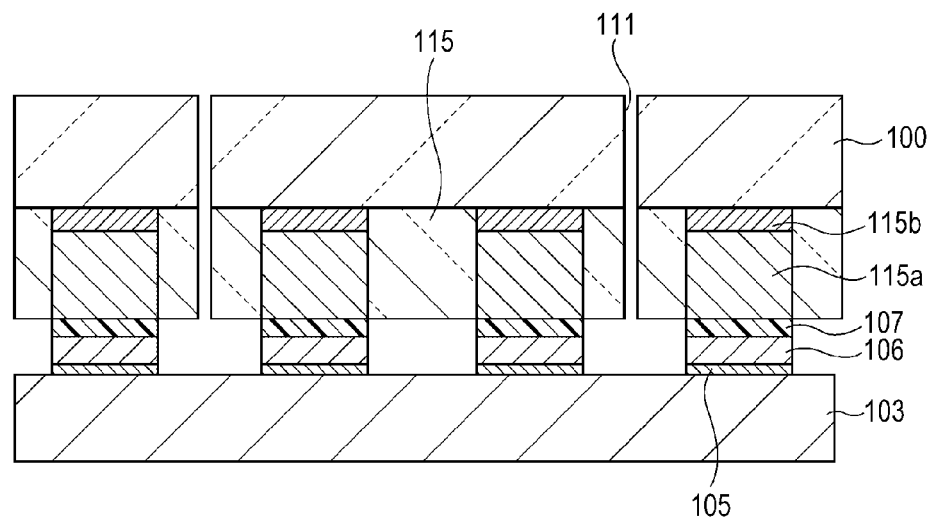
FIG. 2C is a cross-sectional view illustrating the steps of exposing the DFR and bonding the second substrate according to the first embodiment.

As illustrated in FIG. 2B, the DFR 115 is partially exposed with a mask 117. To avoid an exposure desensitization effect, which is defined as the effect of desensitizing a surface of the DFR to exposure because of oxygen diffusion, exposure is usually performed through the protective PET film. Here, exposure is performed after removal of a protective PET film 116a. Thus, an unexposed or weakly exposed portion 115b due to the exposure desensitization effect is formed in the surface layer of the DFR 115, so that the tackiness or adhesiveness of the DFR surface is left. In this way, exposed portions 115a and the unexposed or weakly exposed portion 115b are formed in the DFR 115. Subsequently, as illustrated in FIGS. 2A and 2C, a glass substrate 100, which serves as the second substrate, is aligned with and bonded to the surface of the DFR 115, on which surface tackiness remains, by hot-pressing at, for example, 100 degrees (Celsius). Separation grooves 111 (spaced at intervals of, for example, several millimeters) are formed only through the second substrate 100 and the DFR 115, thereby separating the second substrate 100 into a plurality of segments. As a method for forming the separation grooves, dicing may be employed from the viewpoint of achieving good handleability and low cost. Alternatively, a plurality of substrate segments may be bonded to the surface of the DFR 115 so as to be separated from each other. In this case, the separation grooves may not be formed.

As illustrated in FIGS. 3A and 3B, a sodium carbonate developing solution and rinse water are showered through the separation grooves 111 in the second substrate 100 to develop the DFR 115. In this case, the second substrate 100 may be hot-pressed (here, the DFR 115 is negative) to the extent that the unexposed or weakly exposed portion 115b directly below the second substrate 100 is sufficiently resistant to the developing solution. In this way, as illustrated in FIG. 3B, the removal of the unexposed portion of the DFR 115 affords a substrate structure, which is a composite member, including the first substrate 103 bonded to the second substrate 100 with the exposed portions 115a and the unexposed or weakly exposed portion 115b provided therthetween.

Figure 4:
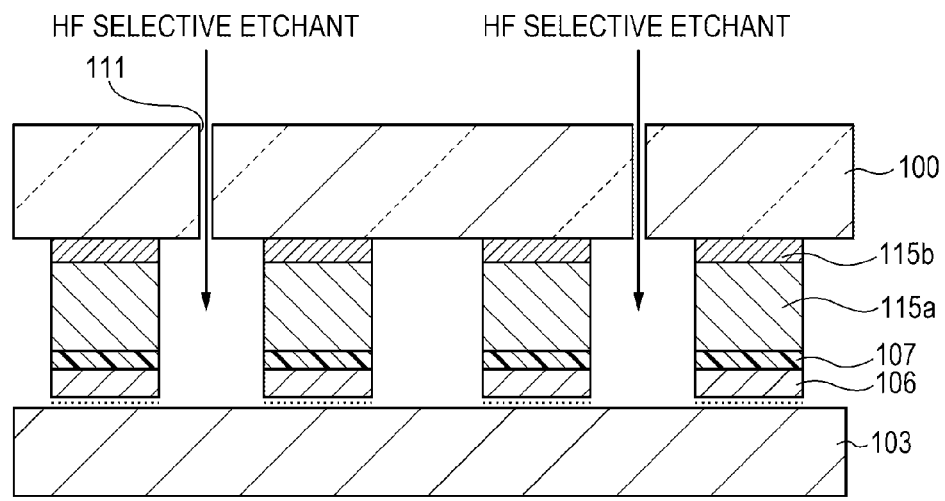
FIG. 4 is a cross-sectional view illustrating a step of separating the first substrate from a substrate structure according to the first embodiment.

Next, the etching sacrificial layers 105 are etched by being brought into contact with an etching solution through the grooves 111, thereby separating the first substrate 103 from the composite member. Thus, the second substrate 100 provided with the first and second functional regions 101 and 102 is prepared as illustrated in FIG. 4. The separated compound semiconductor substrate 103, which serves as the first substrate, can be reused to form other functional regions including compound semiconductor films. In the case where the grooves 111 are deep, outlets of the grooves 111 can be occluded by bubbles of a gas (hydrogen) generated by etching the etching sacrificial layers composed of, for example, AlAs. In such a case, ultrasound may be applied to a solution used for etching and a wafer such as a compound semiconductor substrate continuously or intermittently. Furthermore, alcohol or a lubricant that reduces wetting angle may be added to an etchant (for example, hydrofluoric acid) to suppress the generation of bubbles or remove bubbles.

In the case of forming the grooves in the second substrate 100, the following method may be employed in place of the foregoing dicing. For example, if the second substrate is a silicon substrate, through grooves may be formed in an atmosphere containing, for example, $SF_6$, by RIE using fluorine. The radical species is not limited to fluorine. If a wet process is used, for example, NaOH, KOH, or TMAH may be used. A mask layer used for the formation of the grooves is formed with a resist on the surface of the silicon substrate, and then the grooves are formed in the silicon substrate using the mask.

Dry etching such as RIE or wet etching may be used. Alternatively, sandblasting may be used in which a groove is formed by blowing fine quartz particles or the like against an exposed portion to physically break the silicon substrate. For example, such a through groove can be formed in a silicon wafer having a thickness as large as several hundreds of micrometers without reducing the aspect ratio while side walls are protected. Furthermore, such a through groove can also be easily formed in a member such as a glass substrate. The grooves may be formed by blowing solid particles like sandblasting or applying fluid energy in place of the formation of the grooves by chemical etching. A laser drill or a microdrill may be used. As described above, the composite member is prepared as illustrated in FIG. 3B, the composite member including the groove 110 formed in the compound semiconductor film 106 and the separation grooves 111 formed through the second substrate 100 so as to communicate the groove 110.

A method for preparing the second substrate illustrated in FIG. 4 is not limited to the foregoing method. For example, the following method may be employed: A fluid is blown against a side face of or near an interface separating layer (which is arranged in place of the etching sacrificial layers) of the composite member to separate the compound semiconductor substrate 103 from the composite member, thereby preparing the second substrate.

Figure 5:
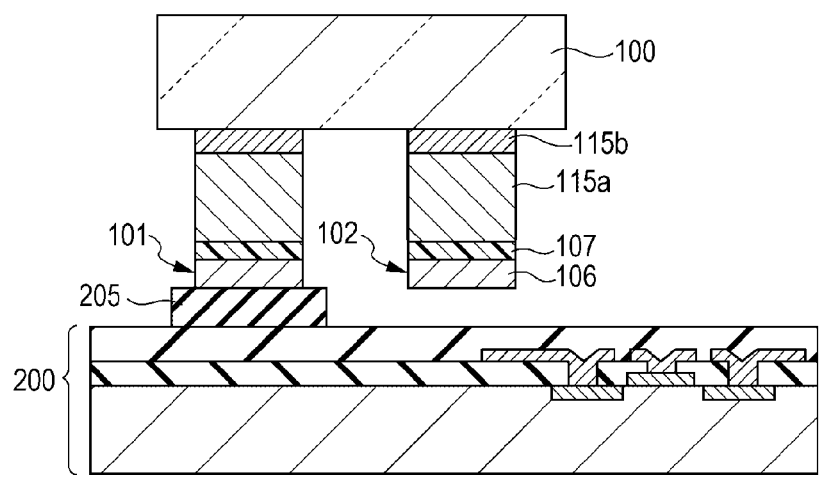
FIG. 5 is a cross-sectional view illustrating a step of selectively transferring a functional region from the second substrate according to the first embodiment.

Selective transfer of the functional regions onto a device substrate will be described below. Here, a connecting layer 205 having a predetermined thickness is formed on at least one of the first functional region 101 to be selectively transferred and a region of a third substrate 200 onto which the first functional region 101 will be transferred. In this embodiment, as illustrated in FIG. 5, the connecting layer 205 is formed on the third substrate 200 including a driving circuit. A method for forming the connecting layer 205 is as follows: The connecting layer 205 (organic insulating layer) having a predetermined thickness is formed on the third substrate 200. Only a region of the connecting layer 205 onto which the first functional region 101 will be transferred is masked with a resist. Etching is performed by chemical etching or RIE to arrange the connecting layer 205 only in a desired region as illustrated in FIG. 5. The resist is removed with, for example, an ashen. Here, the connecting layer 205 has a thickness of 2.0 micrometers to 5.0 micrometers and a sufficiently smooth surface. Such a thickness can prevent the second functional region 102 from being strongly pressed against the surface of the third substrate 200 when the first functional region 101 is bonded to the connecting layer 205. In this embodiment, the connecting layer 205 may have a thickness of 1.0 micrometers to 10 micrometers. A thickness of 1.0 micrometers or less causes a reduction in the effect described above. A thickness of 10 micrometers or more is highly likely to cause a problem such as a break at a step when the functional region is electrically connected to a circuit or the like formed in the substrate after the transfer of the functional region. Furthermore, in this embodiment, predetermined surface roughness may be formed on the surface of a region of the third substrate 200 corresponding to a region other than the first functional region 101 before the transfer of the functional region, as needed. In this case, even if the surface of the third substrate 200 comes into contact with the second functional region 102, which is not a target to be transferred, by a pressure applied during the bonding, it is possible to effectively prevent the bonding of them. The surface roughness may be formed by over-etching when the connecting layer 205 (organic insulating layer) is formed. An uneven surface is sufficiently rougher than the surface of the connecting layer 205. With respect to the degree of smoothness of the surface of the connecting layer 205, for example, (the maximum difference between the peak and the valley of surface roughness) is set to 2 nm or less, and $R_{pv}$ (the mean difference between the peak and the valley of surface roughness) is set to 0.2 nm or less. With respect to the degree of roughness of the uneven surface, $R_{pv}$ (the maximum difference between the peak and the valley of surface roughness) may be set to 2 nm or more, and $R_a$ (the mean difference between the peak and the valley of surface roughness) may be set to 0.2 nm or more.

As described above, the plural functional island regions including the second functional region 102 and the first functional region 101 are provided on the DFR 115 arranged on the second substrate 100. In this embodiment, a predetermined surface roughness is formed on at least the surface of a region of the third substrate 200 corresponding to the second functional region 102 left on the second substrate 100 other than the first functional region.

In this embodiment, the connecting layer 205 is, for example, a film composed of an organic substance. An example of the film composed of an organic substance is an organic insulating film composed of, for example, polyimide. In addition to polyimide, an epoxy-based adhesive may be used. As the insulating film, in addition to the foregoing film composed of an organic substance, a spin-on polymer, in which a methyl group, an ethyl group, a phenyl group, or the like is incorporated into an insulating inorganic oxide film such as a silicon oxide film to increase plasticity, or an organic spin-on glass (org. SOG) may be used. For example, in the case where a circuit region is provided on and/or in the silicon substrate serving as the third substrate 200, the following method may be employed. An insulating silicon oxide film which has a certain degree of adhesiveness at a prebake temperature of about 100 degrees (Celsius) and which is used to increase the flatness of the circuit region may be formed on the third substrate 200 in a predetermined thickness using an organic SOG and then patterned. In this embodiment, a certain degree of adhesiveness of the surface of the connecting layer 205 after prebake treatment may result in efficient bonding in the subsequent bonding step. In general, tackiness (adhesiveness) is believed to be provided owing to silanol groups, which are hydrolyzable groups, or alkoxy groups, which are organic components, contained in an organic insulating substance (spin-on polymer). Dehydration condensation of the groups or the components proceeds at a treatment temperature, increasing the bonding strength (adhesion strength) between wafers or between elements. With respect to plasticity, among organic components, a nonhydrolyzable group contributes to the stable plasticity of a substance at a high temperature (more than 400 degrees (Celsius)). Maximum factors that determine the success or failure of a bonding technique are known as the surface flatness and particles. Thus, the arrangement of an organic insulating layer having plasticity and tackiness relieves the flatness required to a bonding surface and an underlying layer including a device structure and so forth. Furthermore, particles can be allowed to be buried in the organic insulating layer owing to the plasticity, depending on the size of particles. Hence, it is possible to substantially eliminate the influence of the particles. Plasticity plays a potent role in the relaxation of stress accumulated when the layer has an increased thickness. So, the formation of a relatively thick layer having a thickness of one micrometer or more and a low organic component content can cause defectives such as cracks. From these reasons, an organic component content of about 1% by weight or more of the hydrolyzable and nonhydrolyzable groups contained in the organic SOG may result in adhesiveness and plasticity and may allows the layer to be stable even if the layer has a thickness on the order of micrometers.

As described above, examples of the third substrate 200 include a semiconductor substrate, a silicon substrate, a silicon wafer having a surface on which an oxide layer is formed, and a silicon wafer provided with a desired electric circuit such as a driver circuit. The term "driver circuit" used herein indicates, for example, a circuit configured to drive and control a light-emitting diode (LED) constituted by a compound semiconductor multilayer film. The silicon substrate may be a CZ wafer or a substrate including an epitaxial silicon layer on a surface thereof. Alternatively, an SOI substrate may be used in place of the silicon substrate.

Figure 6A:
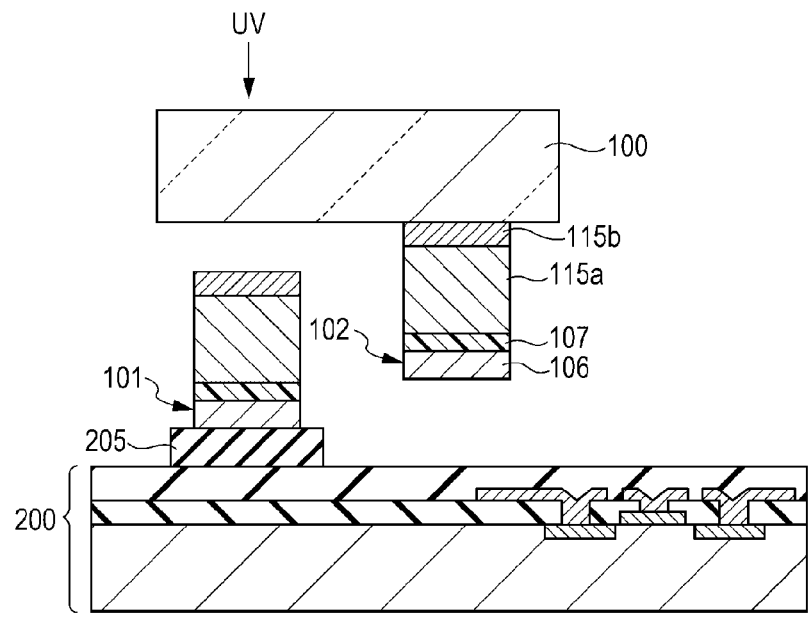
FIG. 6A is a cross-sectional view illustrating a state in which the functional region is selectively transferred from the second substrate according to the first embodiment.

Steps of bonding the first functional region 101 to the third substrate 200 with the connecting layer 205 and separating the second substrate 100 from the first functional region 101 at the DFR 115 will be described below. As illustrated in FIG. 5, the first functional region 101 on the DFR 115 arranged on the second substrate 100 is aligned with and bonded to the connecting layer 205. As illustrated in FIG. 6A, the second substrate 100 is then separated from the first functional region 101 at the DFR 115. In this embodiment, the property in which the DFR is capable of being brought into a separable state by a certain treatment is used. Here, laser light having a wavelength (300 nm to 400 nm) of ultraviolet (UV) light is limited, and scanning is performed the limited laser light. That is, it is possible to selectively irradiate a desired portion having a desired area of the DFR 115 with UV light. In this way, UV-irradiation from the side of the transparent substrate 100 that transmits light results in the decomposition of the DFR 115 or a reduction in the bonding strength of the DFR 115, thereby separating the second substrate 100 from the first functional region 101. Since the laser light is limited, the DFR 115 on the second functional region 102 is not irradiated with UV light. Thus, as illustrated in FIG. 6A, the second functional region 102 is left on the second substrate 100 side and is not transferred. UV-irradiation may be performed using a light-shielding layer or a stencil mask used to prevent a portion that does not need UV-irradiation from being irradiated with UV light. In this case, UV-irradiation may be performed with laser light having sufficient strength without limitation. In the case where UV-irradiation is performed over the entire region, an I-line UV-lamp or an LED that emits UV-light may be used.

Figure 6B:
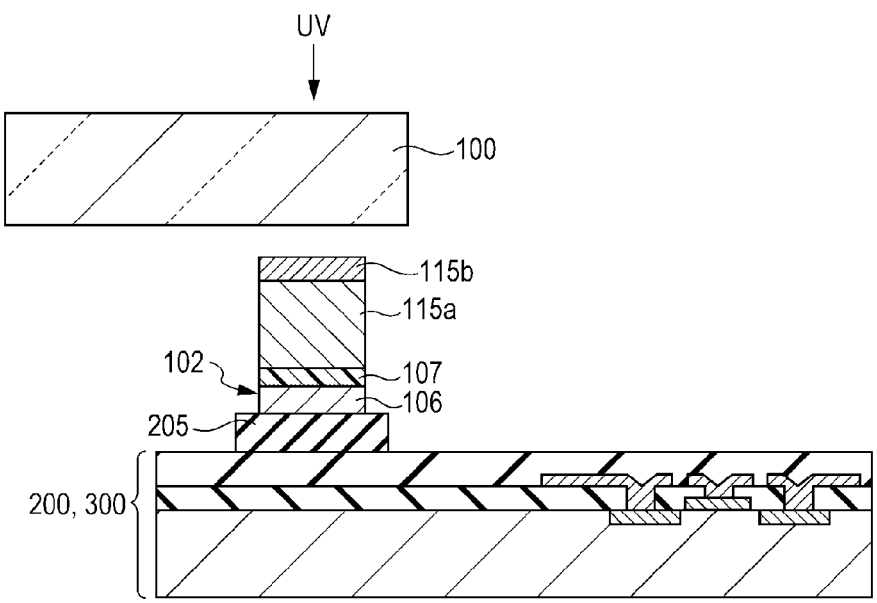
FIG. 6B is a cross-sectional view illustrating a state in which the functional region is selectively transferred from the second substrate according to the first embodiment.

The second functional region 102 left on the second substrate 100 side can be further transferred onto another substrate as described below. In this case, another substrate described above may be the third substrate. The first functional region and the second functional region may be transferred onto one substrate in different positions. In the case where the second functional region 102 is further transferred onto another substrate, the second functional region 102 may be transferred in substantially the same way as the transfer of the first functional region 101. That is, as illustrated in Ha. 6B, the connecting layer 205 (organic insulating layer) is formed on a fourth substrate 300 (or the third substrate 200). Only a region of the connecting layer 205 onto which the second functional region 102 will be transferred is masked with a resist. Etching is performed by chemical etching or RIE to arrange the connecting layer 205 only in a desired region. The second functional region 102 is aligned with and bonded to the connecting layer 205. As illustrated in FIG. 6B, the second substrate 100 is separated from the second functional region 102 at the DFR 115 by UV-irradiation.

As a bonding method, after the second substrate is separated into segments, each segment including many active layers may be successively bonded onto a silicon substrate wafer including a device circuit. Alternatively, to reduce the process time, the entirety of a wafer may be bonded to a wafer in one operation. The term "segments" used here refer to, for example, a region of an active layer, constituting one or more circuit units, onto which the functional region is transferred. In this embodiment, even in the case of using substrates having different sizes, the functional regions can be transferred without waste by repeating the transfer. For example, a 4-inch substrate, which is the second substrate, is cut into a plurality of segments including the functional regions. The functional regions are densely arranged in accordance with the size of a destination substrate (e.g., 5-, 6-, 8-, or 12-inch silicon wafer). Among the functional regions arranged on the second substrate, only the functional regions corresponding to a first region, which is a destination region, of the 5-, 6-, 8-, or 12-inch substrate, which is the third substrate, are selectively transferred onto the first region. Among the functional regions arranged on the second substrate, only the functional regions corresponding to a second region, which is a residual destination region, of the 5-, 6-, 8-, or 12-inch substrate, which is the third substrate, are selectively transferred onto the second region. In this way, even in the case of using the substrates having different sizes, the functional regions can be selectively transferred onto the destination regions without waste by the repetition of the transfer step. This method is important for the bonding between dissimilar substrates, between dissimilar materials, or between dissimilar devices. In other words, this method is important when a substrate, composed of an expensive material, with a relatively small diameter is bonded to a relatively inexpensive substrate, composed of, for example, silicon, with a large diameter or its device group, the inexpensive substrate with a large diameter being commercially available. In the case of bonding between dissimilar substrates which have an essential difference in terms of substance and which have extremely different diameters or prices, this method may provide a high economic effect. Furthermore, a plurality of active layers are present in the segmented regions. The repetition of the transfer of the device active layers may result in a plurality of large-diameter host wafers including dissimilar active layers and having a large diameter. This method may provide a higher economic effect than that in the case of a single transfer.

In the case where the second functional region 102 is further transferred onto another substrate, the connecting layer 205 having a predetermined thickness is formed on at least one of the second functional region left on the second substrate and a region of the fourth substrate onto which the second functional region is transferred. The second functional region 102 is bonded to the fourth substrate 300 with the connecting layer 205, and then the second substrate 100 is separated from the second functional region 102 at the DFR 115. In this case, a predetermined surface roughness may also be formed on at least the surface of a region of the fourth substrate 300 corresponding to a region of the second substrate 100 other than the second functional region. However, if the parallelism between the substrates is sufficiently ensured (for relatively small-area segments, this condition is often sufficiently met), the formation of such a rough surface is not needed.

Figure 21A:
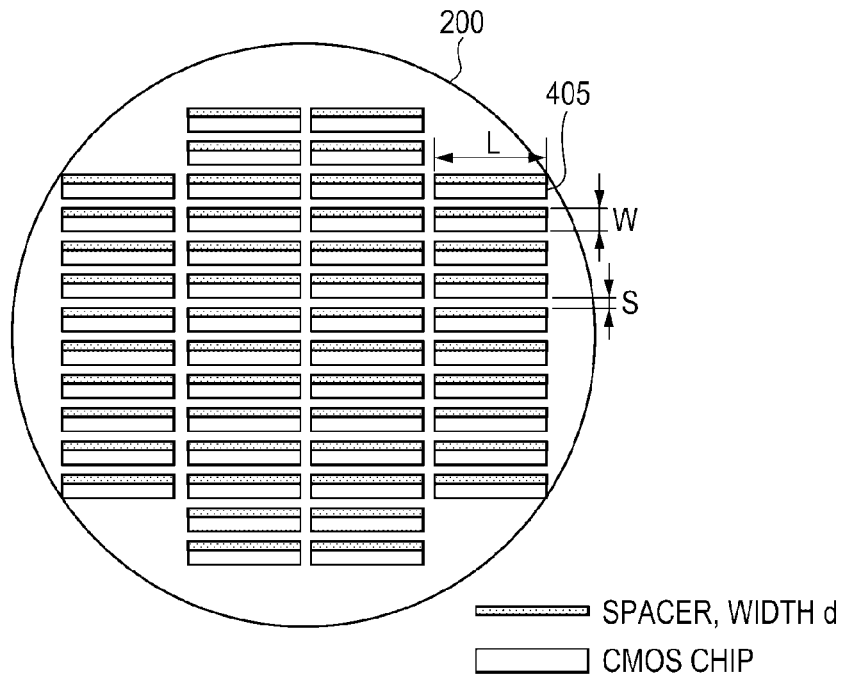
FIG. 21A is a plan view illustrating a plurality of regions on a third substrate onto which functional regions will be transferred.
Figure 21B:
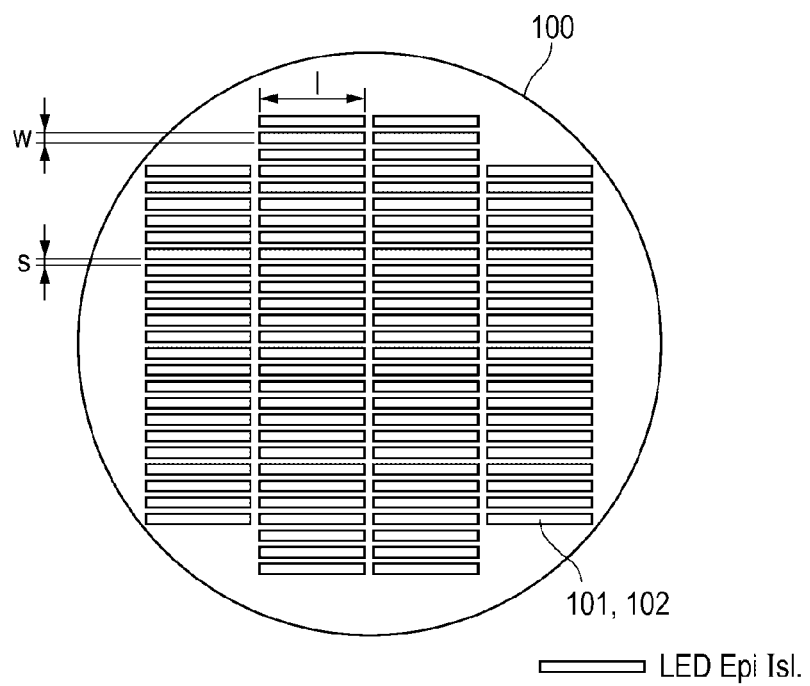
FIG. 21B is a plan view illustrating the plural functional regions on the second substrate.
Figure 22A:
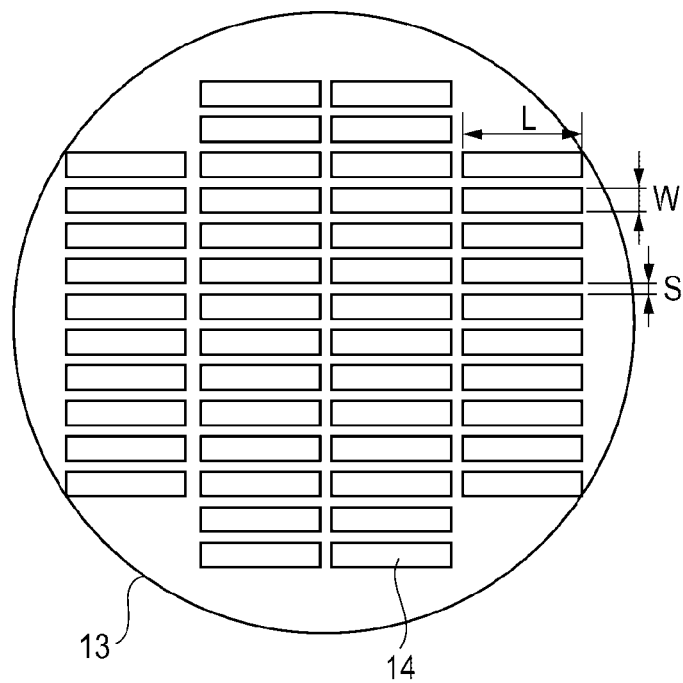
FIG. 22A is a plan view illustrating a plurality of regions on a substrate onto which functional regions will be transferred according to the related art.
Figure 22B:
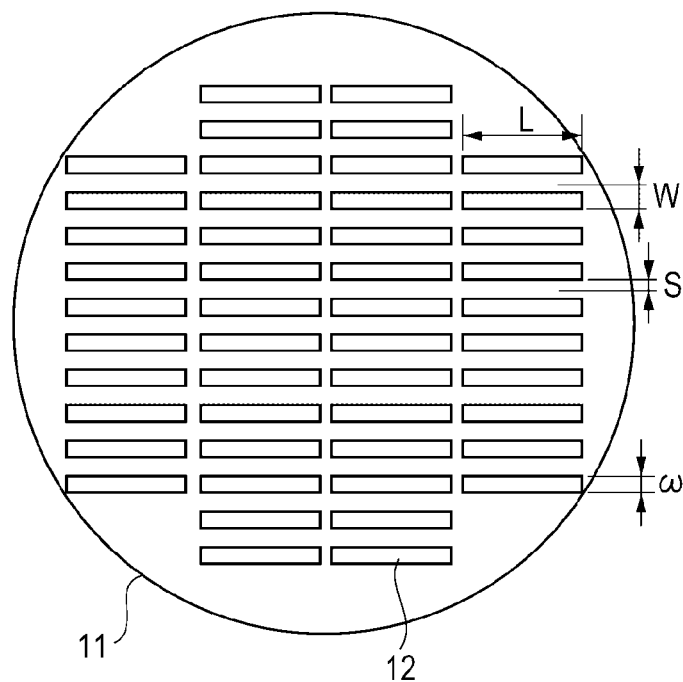
FIG. 22B is a plan view illustrating a plurality of functional regions on a seed substrate according to the related art.

The first and second functional regions 101 and 102 may be arranged on the second substrate 100 in any island pattern. Typically, as illustrated in FIG. 21B, the first and second functional regions 101 and 102 are arranged on the second substrate 100 at predetermined intervals. In this case, for example, as illustrated in FIG. 21A, regions 405 (each including a region where the connecting layer 205 is arranged and including a CMOS chip) of the third substrate 200 bonded to the first functional region 101 are arranged at predetermined intervals. In this configuration, in the case where only the first functional region 101 on the second substrate 100 is transferred onto a region in which the connecting layer 205 is arranged on the third substrate 200, when the following conditions are satisfied, the transfer is accomplished efficiently and effectively. As illustrated in FIGS. 21A and 21B, the following conditions may be satisfied. That is, w, l, s, W, L, and S may met Expressions 1 to 3:

[Math.2]

$$l \leq L, \tag{Expression 1}$$

$$W > w, \text{ and} \tag{Expression 2}$$

$$W+S > w+s, \tag{Expression 3}$$

where l represents the length of the unit region of the first and second functional regions, w represents the width of the unit region, s represents the spacing between the unit regions, L represents the length of the unit region of the third substrate to be bonded to the first functional region, W represents the width of the unit region, and S represents the spacing between the unit regions.

Furthermore, Expressions 4 to 6 may be met:
[Math.3]

$$l=L, \tag{Expression 4}$$

$$W=n*w, \text{ and} \tag{Expression 5}$$

$$W+S=n(W+s), \tag{Expression 6}$$

where n represents an integer of 2 or more. Here, the selective transfer of the first functional region 101 densely arranged on the second substrate 100 onto the region in which the connecting layer 205 is arranged on the third substrate 200 is repeated, for example, n times. In this case, when the functional regions to be formed into light-emitting layers or the like are transferred onto circuit elements or the like, the arrangement of the functional regions and the number of the functional regions per wafer are not substantially limited to the arrangement of the circuit elements or the like. This results in an increase in the proportion of the area usable for light-emitting layers or the like on the first substrate, which is a seed substrate, per unit area. It is thus possible to effectively use the compound semiconductor wafer, which is several tens of times more expensive than a silicone wafer. This may provide a more advantageous economic effect for a complex multifunctional element integrated circuit.

Here, the third substrate 200 illustrated in FIG. 21A includes the third functional regions 405 provided with CMOS chips. The first functional regions 101 are bonded to the third functional regions with the connecting layers 205. Similarly, the fourth substrate includes fourth functional regions. The second functional regions 102 may be bonded to the fourth functional regions.

According to this embodiment, any region of the plural functional regions arranged on one substrate may be selectively and reliably transferred onto another substrate using the tackiness and the separability induced by treatment in addition to the original property (photosensitivity) of the DFR. For example, part of the functional regions densely arranged on the second substrate may be transferred onto another substrate without reducing the yield. Furthermore, each of the functional regions arranged on the second substrate may be repeatedly transferred onto another substrate. Moreover, the semiconductor region of one seed substrate, which is the first substrate, may be effectively used, thereby producing elements at low cost.

Second Embodiment

A second embodiment will be described below with reference to FIGS. 7A to 10. The second embodiment is characterized in that after the DFR is bonded to the second substrate, part of the DFR is exposed and patterned through the second substrate. A method for preparing the compound semiconductor substrate 103 including the first and second functional regions 101 and 102 is as described in the first embodiment.

Figure 7A:
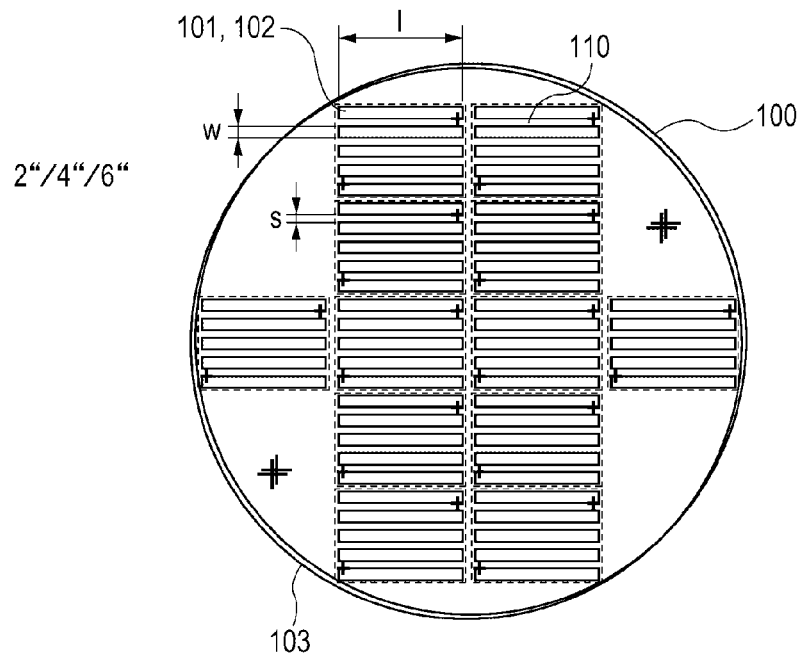
FIG. 7A is a plan view illustrating a step of bonding the DFR to the second substrate according to a second embodiment.
Figure 7B:
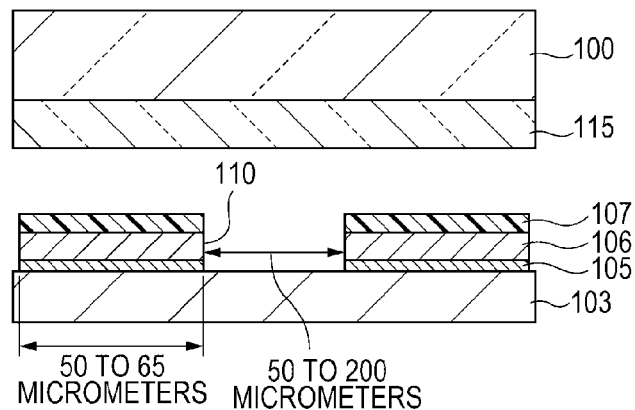
FIG. 7B is a cross-sectional view illustrating the step of bonding the DFR to the second substrate according to the second embodiment.
Figure 7C:
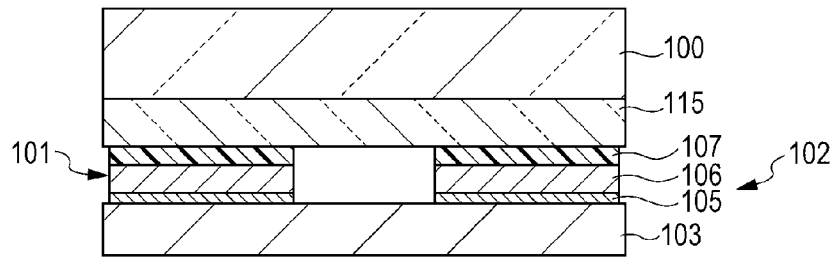
FIG. 7C is a cross-sectional view illustrating the step of bonding the DFR to the second substrate according to the second embodiment.
Figure 8A:
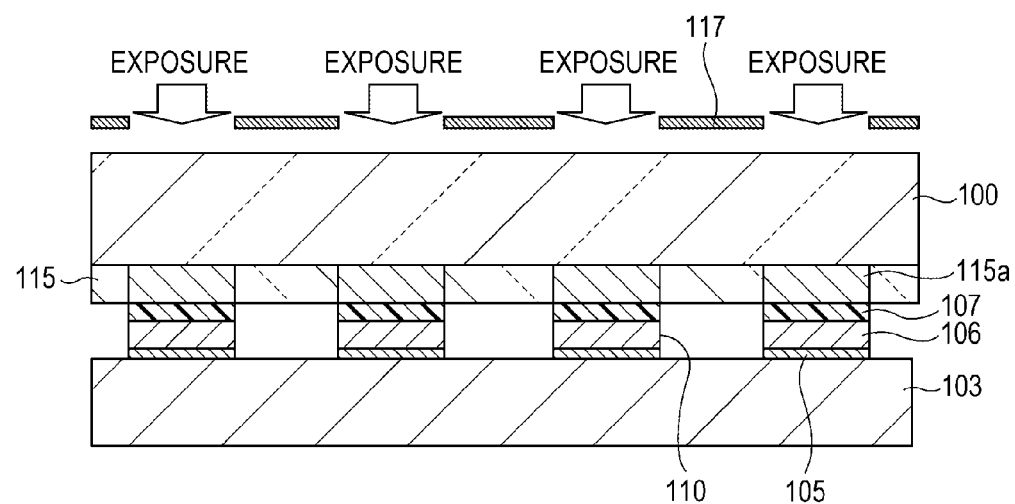
FIG. 8A is a cross-sectional view illustrating the steps of exposing and developing the DFR according to the second embodiment.
Figure 8B:
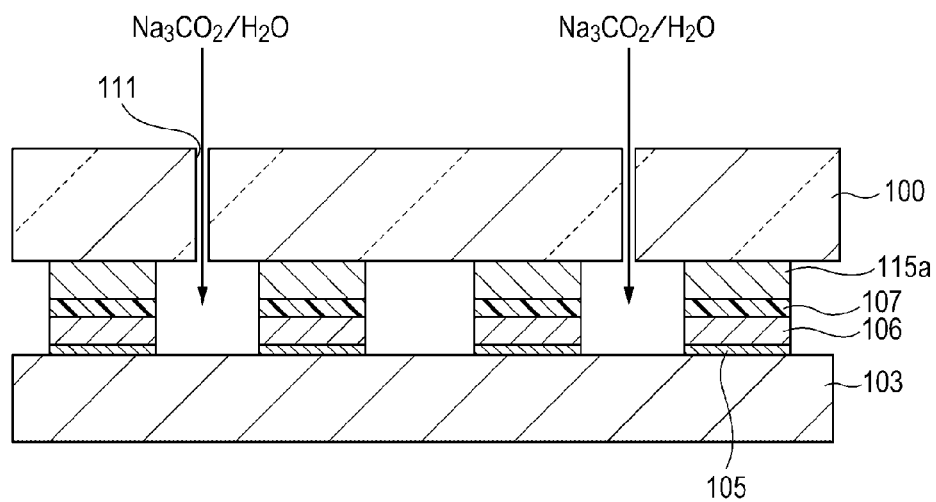
FIG. 8B is a cross-sectional view illustrating the steps of exposing and developing the DFR according to the second embodiment.

As illustrated in FIG. 7B, the DFR 115 from which one protective PET film has been peeled is attached to the second substrate 100 such as a transparent glass substrate. As illustrated in FIGS. 7A and 7C, the DFR 115 from which the other protective PET film has been peeled is bonded to the patterned first substrate 103 by hot-pressing at, for example, 100 degrees (Celsius) using alignment marks. Next, part of the DFR 115 is exposed and patterned with the mask 117 using the alignment marks. The DFR 115 is patterned in accordance with the pattern of the functional regions on the first substrate 103. As illustrated in FIGS. 8A and 8B, the exposed portions 1.15a and unexposed portion are formed in the DFR 115. The DFR 115 is then developed. For the development of the DFR 115, the separation grooves or holes 111 are formed only through the second substrate 100 and the DFR 115. Then a sodium carbonate developing solution and rinse water are showered through the separation grooves or holes 111 in the second substrate 100 to develop the DFR 115.

Figure 9:
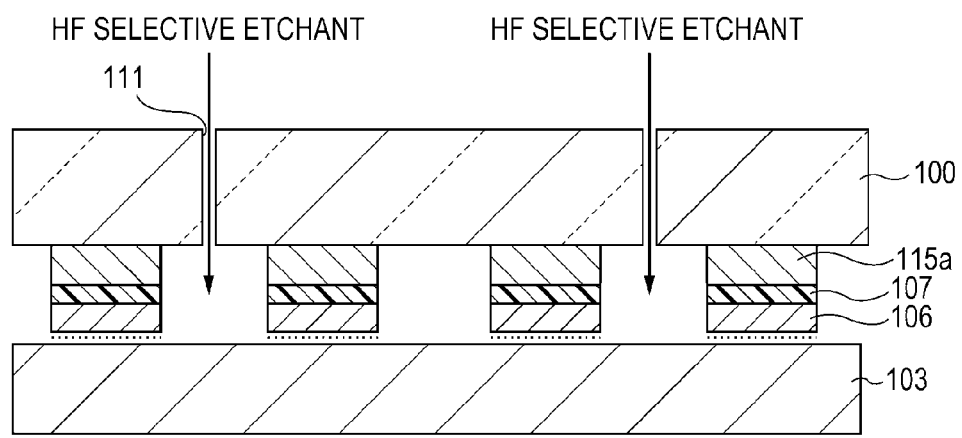
FIG. 9 is a cross-sectional view illustrating a step of separating the first substrate from a substrate structure according to the second embodiment.
Figure 10:
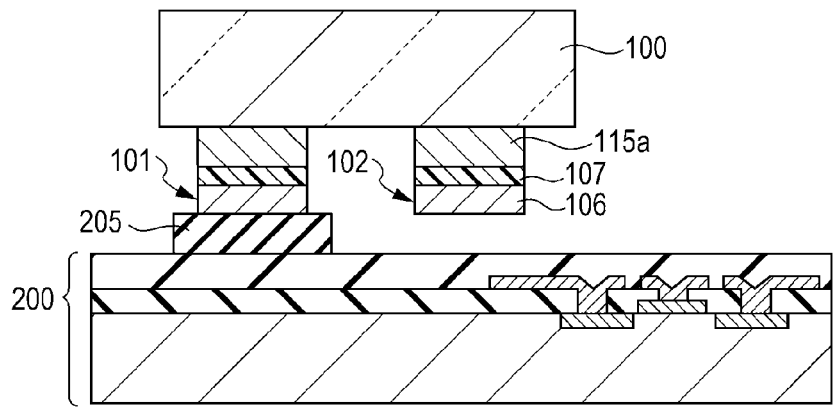
FIG. 10 is a cross-sectional view illustrating a step of selectively transferring the functional region according to the second embodiment.

Next, as illustrated in FIG. 9, the etching sacrificial layers 105 are etched by being brought into contact with the etching solution through the grooves or holes 111, thereby separating the first substrate 103 and preparing the second substrate 100 including the first and second functional regions 101 and 102 as illustrated in FIG. 9. The selective transfer of the functional regions onto another substrate such as a device substrate is performed in the same way as in the first embodiment. FIG. 10 illustrates this selective transfer method. The other points are the same as in the first embodiment.

Figure 11A:
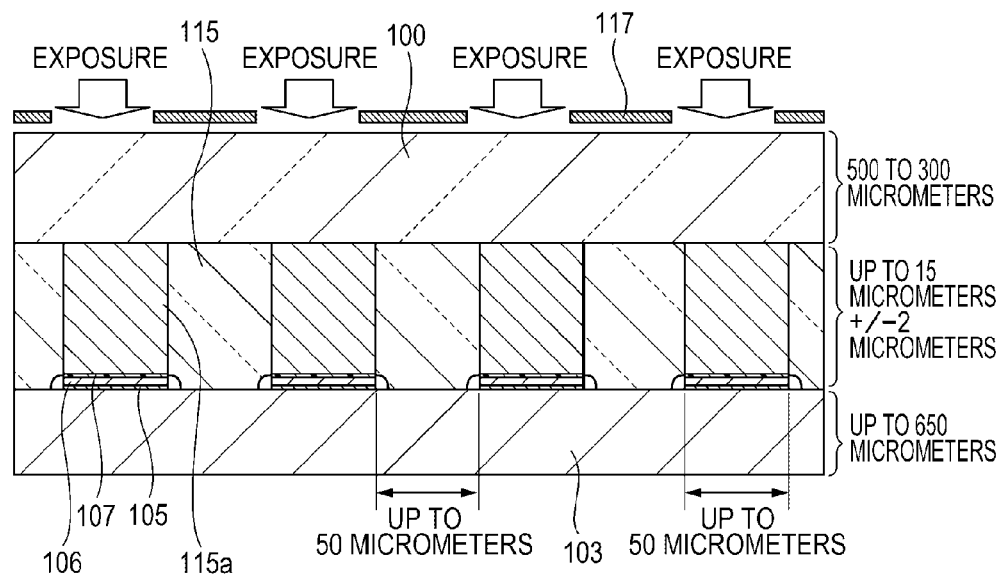
FIG. 11A is a cross-sectional view illustrating a step of exposing the DFR according to a modification of the second embodiment.
Figure 11B:
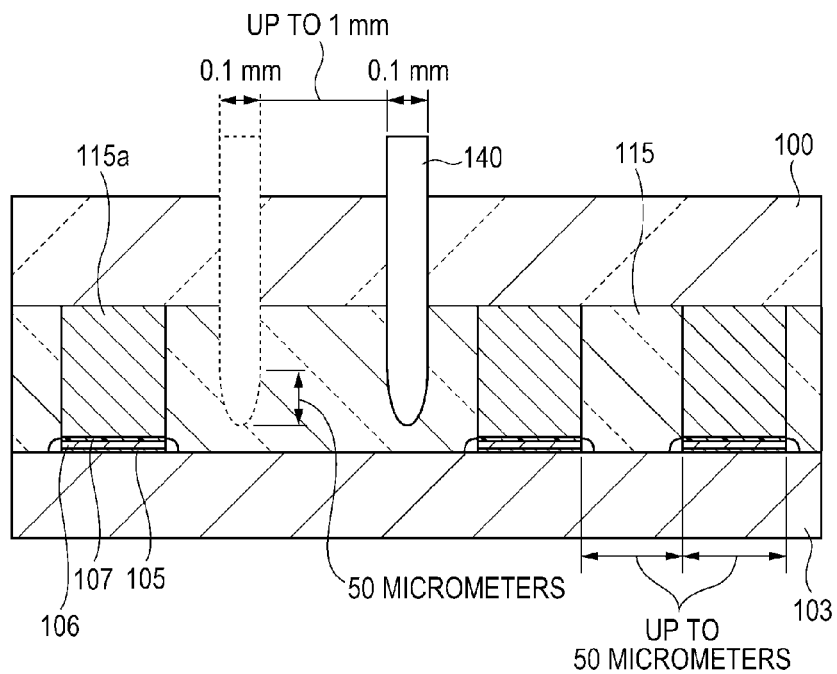
FIG. 11B is a cross-sectional view illustrating the step of exposing the DFR according to the modification of the second embodiment.
Figure 12A:
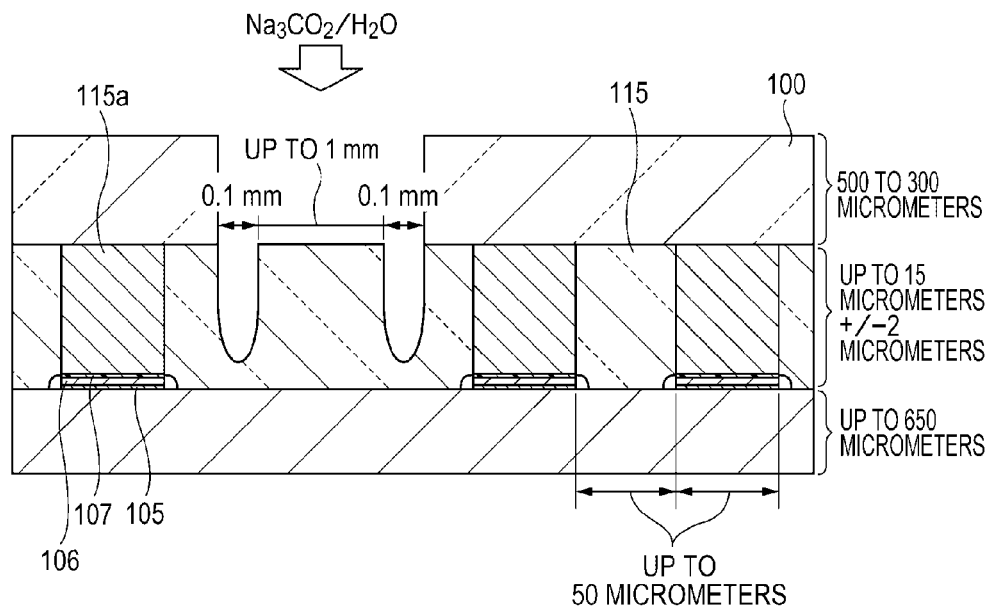
FIG. 12A is a cross-sectional view illustrating a step of developing the DFR to separate the first substrate from the substrate structure according to a modification of the second embodiment.
Figure 12B:
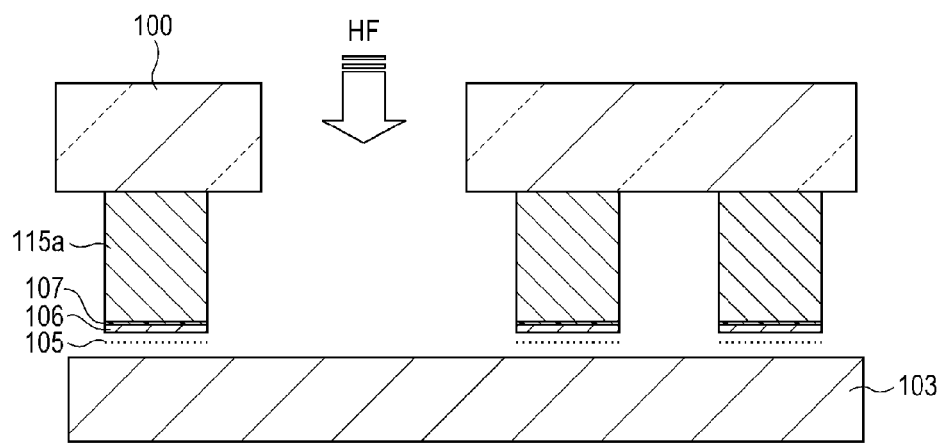
FIG. 12B is a cross-sectional view illustrating the step of developing the DFR to separate the first substrate from the substrate structure according to the modification of the second embodiment.

FIGS. 11A to 12B illustrate modifications of this embodiment. Here, the thicknesses of the functional regions on the first substrate 103 and the DFR 115 are drawn in a more realistic ratio. In this embodiment, to feed the developing solution and the etching solution more smoothly, a groove or hole having a large size is formed with dicing blades 140 in part of the unexposed portion of the DFR 115 as illustrated in FIGS. 11B, 12A, and 12B. Examples of the dimensions are indicated in FIGS. 11A to 12B. According to this embodiment, it is possible to smoothly feed the developing solution and the etching solution into a desired portion, thereby successfully performing the development of the DFR 115 and the etching of the etching sacrificial layers 105.

Third Embodiment

A third embodiment will be described below with reference to FIGS. 13A to 16. The third embodiment is characterized in that the developing solution and the etching solution are easily fed through a side space between the first substrate 103 and the second substrate 100 by using the plural DFR layers. As before, the thicknesses of the functional regions on the first substrate 103 and the DFR 115 are drawn in a realistic ratio here. A method for preparing the compound semiconductor substrate 103 including the first and second functional regions 101 and 102 is as described in the first embodiment.

Figure 13A:
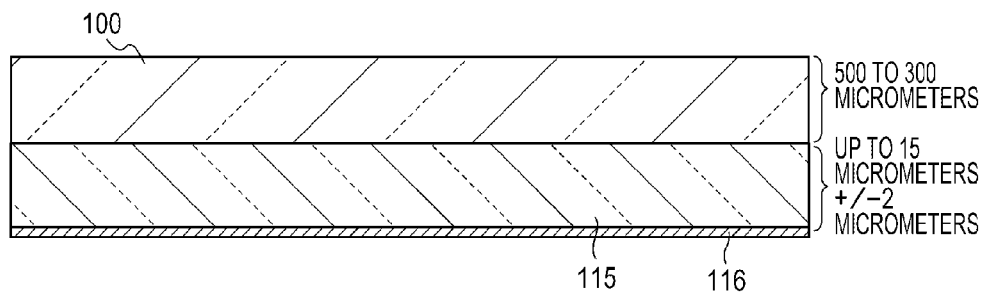
FIG. 13A is a cross-sectional view illustrating the steps of exposing and developing a first DFR according to a third embodiment.
Figure 13B:
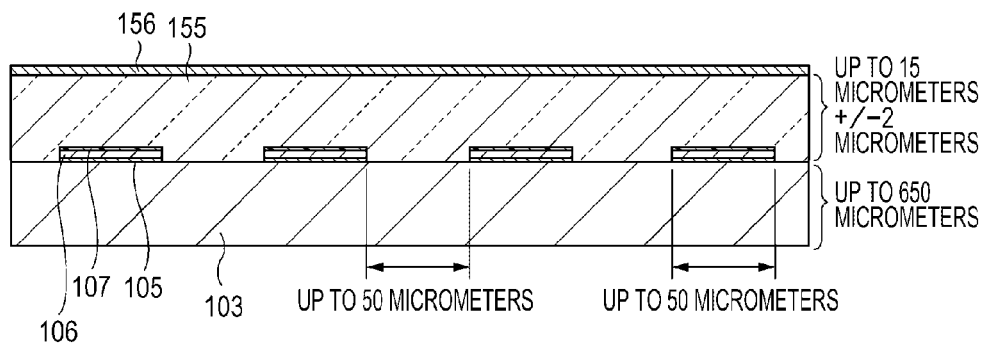
FIG. 13B is a cross-sectional view illustrating the steps of exposing and developing the first DFR according to the third embodiment.
Figure 13C:
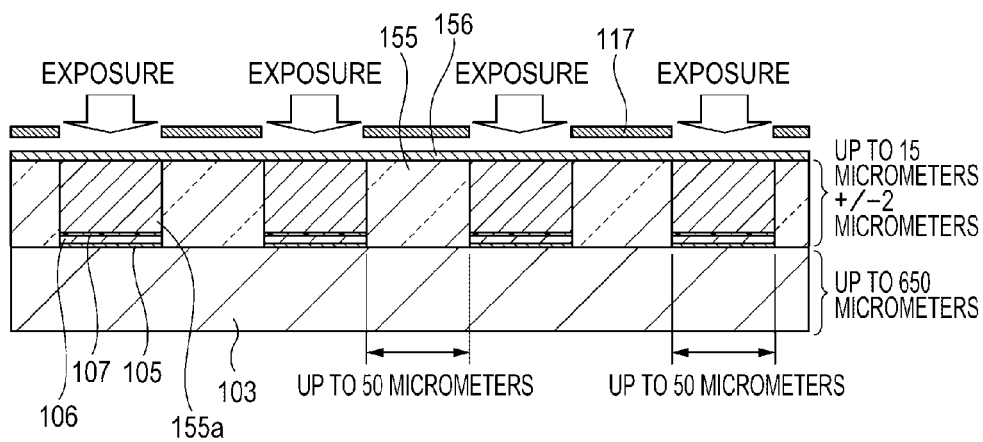
FIG. 13C is a cross-sectional view illustrating the steps of exposing and developing the first DFR according to the third embodiment.
Figure 13D:
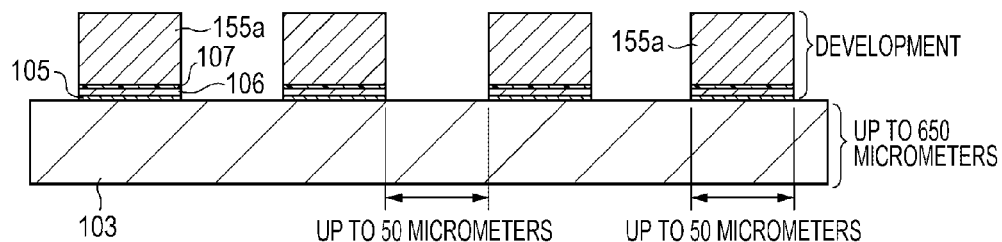
FIG. 13D is a cross-sectional view illustrating the steps of exposing and developing the first DFR according to the third embodiment.
Figure 14A:
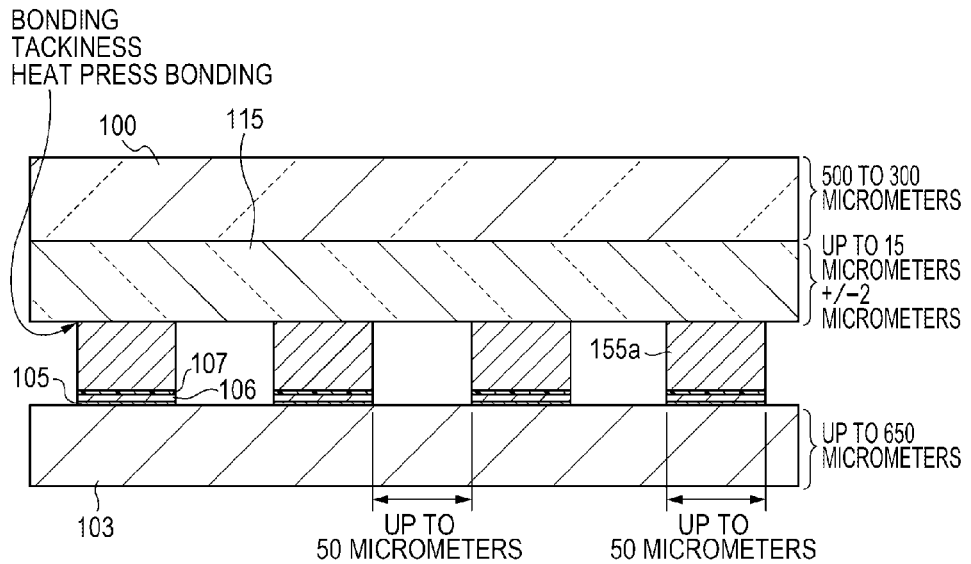
FIG. 14A is a cross-sectional view illustrating a step of exposing a second DFR according to the third embodiment.
Figure 14B:
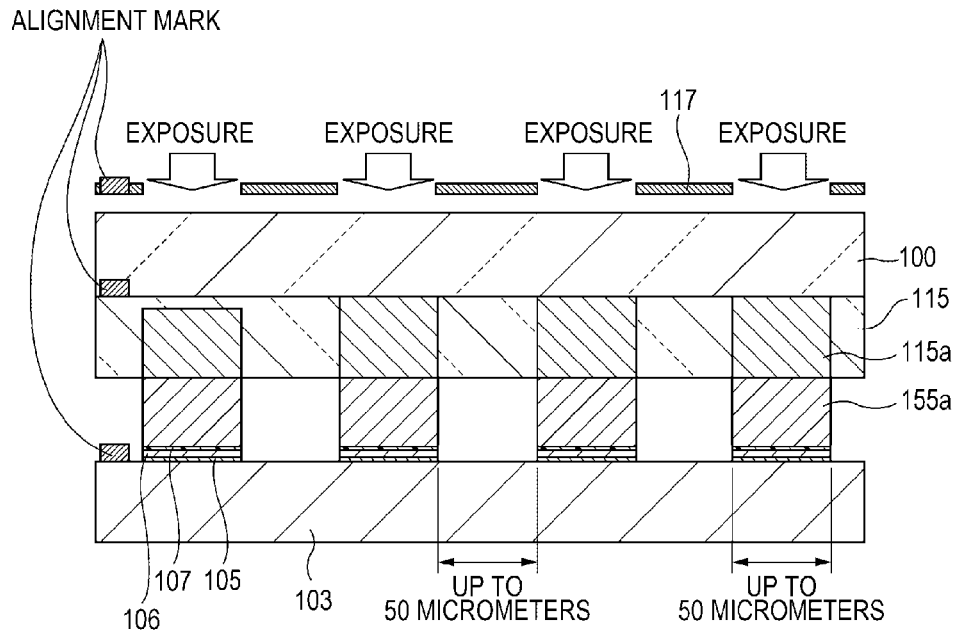
FIG. 14B is a cross-sectional view illustrating the step of exposing the second DFR according to the third embodiment.
Figure 15A:
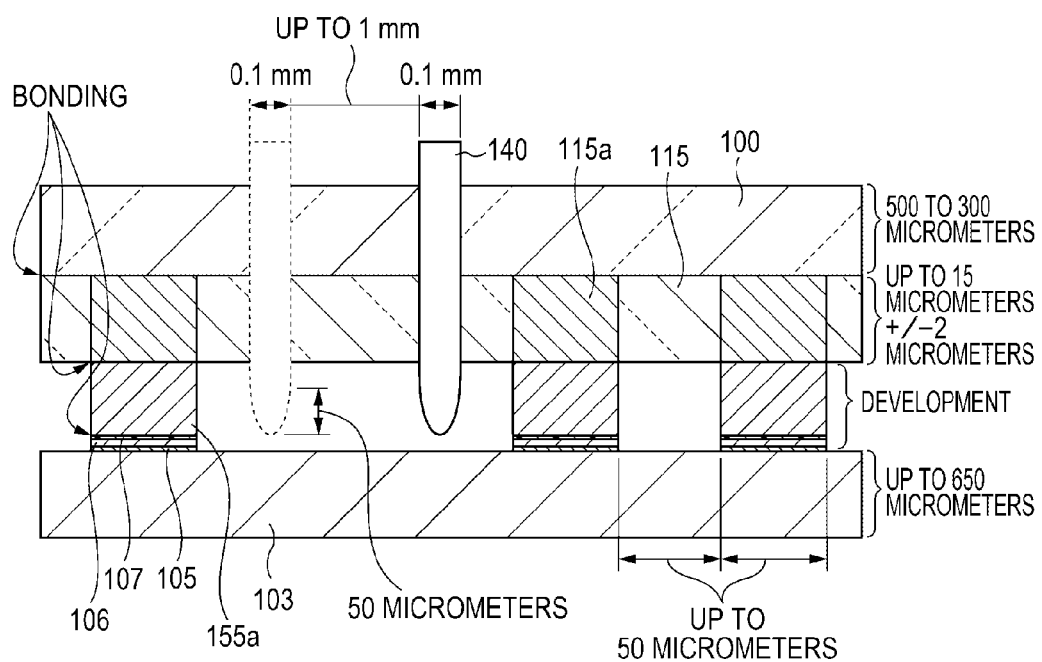
FIG. 15A is a cross-sectional view illustrating a step of developing the second DFR according to the third embodiment.
Figure 15B:
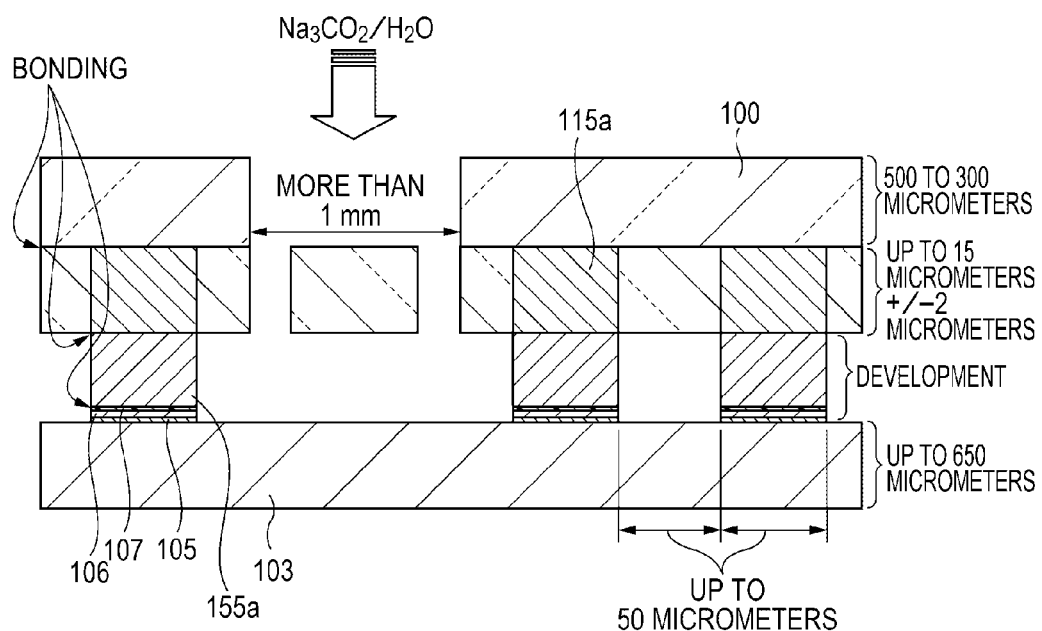
FIG. 15B is a cross-sectional view illustrating the step of developing the second DFR according to the third embodiment.

As illustrated in FIGS. 13A and 13B, the second substrate 100, such as a transparent glass substrate, provided with the second DFR 115 is prepared. The first substrate 103 including the patterned functional regions and provided with a first DFR 155 is prepared. As illustrated in FIGS. 13C and 13D, part of the DFR 155 is exposed and patterned with the mask 117. As illustrated in FIG. 14A, the second substrate 100 provided with the DFR 115 illustrated in FIG. 13A is bonded thereto. To increase the tackiness, heat press bonding may also be employed here. In the case of increasing the tackiness, the heat press bonding may be employed for other portions. As illustrated in FIG. 14B, part of the DFR 115 is exposed with the mask 117 using the alignment marks. As illustrated in FIGS. 15A and 15B, the second DFR 115 is patterned. Again, the dicing blades 140 are used as illustrated in FIG. 11B. The patterning of the DFR 115 is performed in the same way as illustrated in FIGS. 11A to 12B.

Figure 16:
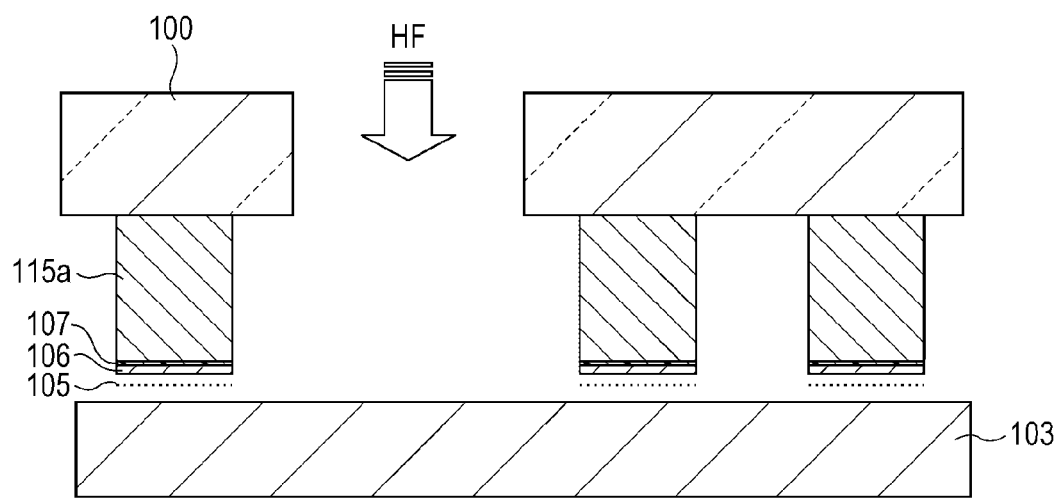
FIG. 16 is a cross-sectional view illustrating a step of separating the first substrate from the substrate structure according to the third embodiment.

As illustrated in FIG. 16, the etching sacrificial layers 105 are etched by being brought into contact with the etching solution through the groove or hole, thereby separating the first substrate 103. Subsequently, the selective transfer of the functional regions onto another substrate is performed in the same way as in the foregoing embodiments.

Fourth Embodiment

A fourth embodiment will be described below with reference to FIGS. 17 and 18. The fourth embodiment is characterized in that the developing solution and the etching solution are easily fed through a side space between the first substrate 103 and the second substrate 100 by aligning and bonding the plural DFR layers that have been exposed and developed. A method for preparing the compound semiconductor substrate 103 including the first and second functional regions 101 and 102 is as described in the first embodiment. A method for forming the exposed and developed first DFR 155 on the first substrate 103 including the patterned functional regions is the same as that described in the third embodiment (see FIGS. 13B, 13C, and 13D).

Figure 17:
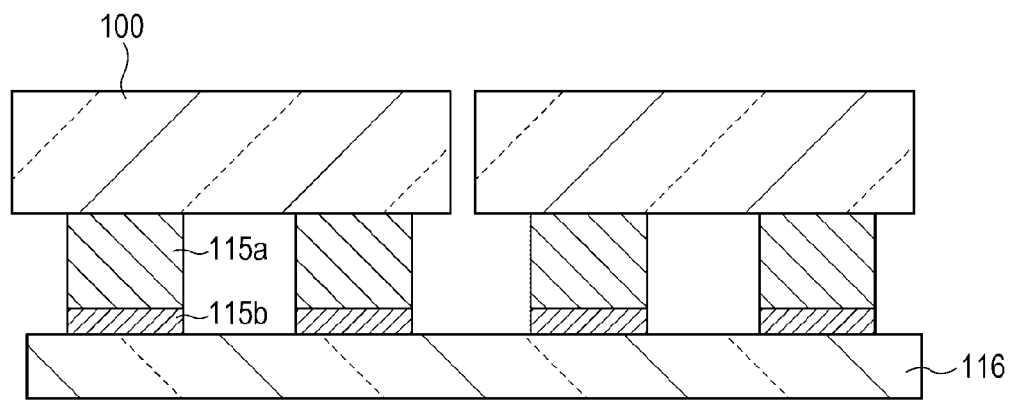
FIG. 17 is a cross-sectional view illustrating the steps of exposing and developing the second DFR according to a fourth embodiment.

In this embodiment, as illustrated in FIG. 17, the second DFR 115 is bonded to the second substrate 100. The DFR 115 is exposed and developed from the opposite side of the second substrate 100 using a mask. In this case, the DFR 115 is exposed while the protective PET film is attached in such a manner that the unexposed or weakly exposed portion 115b is left in the DFR 115. The separation grooves are formed in the second substrate 100. If the substrate is not easily separated into segments with tacky surfaces exposed, dicing may be performed after the PET film 116 is bonded again as illustrated in FIG. 17.

Figure 18:
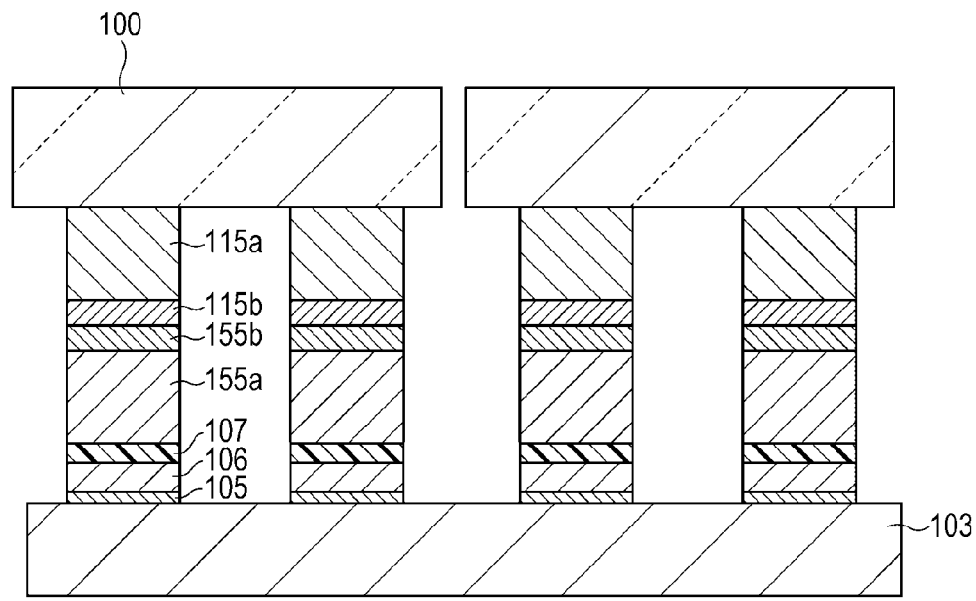
FIG. 18 is a cross-sectional view illustrating a step of bonding the exposed and developed first DFR to the exposed and developed second DFR according to the fourth embodiment.

As illustrated in FIG. 18, when the exposed and developed plural DFR layers are aligned and bonded, a method, for example, heating, pressing, or ultrasound application may be employed. The etching sacrificial layers 105 of a composite member illustrated in FIG. 18 are etched by being brought into contact with the etching solution through a groove or hole, thereby separating the first substrate 103. Subsequently, the selective transfer of the functional regions onto another substrate is performed in the same way as in the foregoing embodiments.

For the transfer method in which at least part of the functional regions arranged on the first substrate including a separation layer that can be brought into a separable state is transferred onto the second substrate, the following modified method may be employed: The first DFR is arranged on the functional regions of the first substrate.

Heat treatment is performed at a predetermined temperature while the functional regions are in contact with first DFR under a predetermined pressure, thereby bonding the functional regions to the first DFR. At least part of the DFR is patterned by exposing and development. The functional regions are patterned by etching with the patterned first DFR serving as a mask. The first substrate is then bonded to the second substrate with the second DFR provided therebetween. The order of the bonding of the second substrate and the second DFR is not limited so long as the first substrate can be bonded to the second substrate with the second DFR provided therebetween. This modified method is characterized in that the functional regions are patterned by etching with the patterned first DFR serving as a mask.

Meanwhile, as described above, in the case of bonding the DFR to an inorganic material component, such as a glass substrate and a functional element, the surface tackiness can be reduced after exposure and development. In the case where appropriate bonding or peeling resistance against a chemical treatment solution is not sufficient, the following treatment may be performed. That is, a silane coupling agent (e.g., aminopropyltrimethoxysilane) is applied to a glass surface by spin coating or dip coating. This results in improvement in tackiness and the bonding strength therebetween because amino groups in the silane coupling agent and carboxy groups in the DFR form ionic bonds, in some cases.

Fifth Embodiment

A fifth embodiment will be described below with reference to FIGS. 19 and 20. The fifth embodiment is characterized in that the liquid resist used to pattern the functional regions on the first substrate is used in place of the DFR. A method for preparing the compound semiconductor substrate 103 including the first and second functional regions 101 and 102 is as described in the first embodiment.

Figure 19:
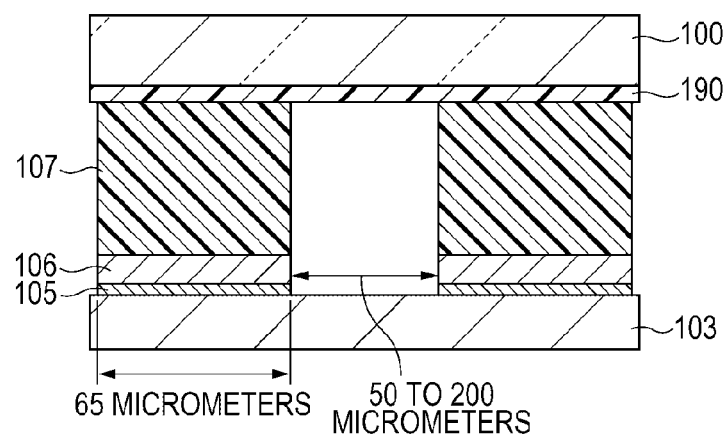
FIG. 19 is a cross-sectional view illustrating a step of bonding the first substrate to the second substrate with a resist provided therebetween according to a fifth embodiment.
Figure 20:
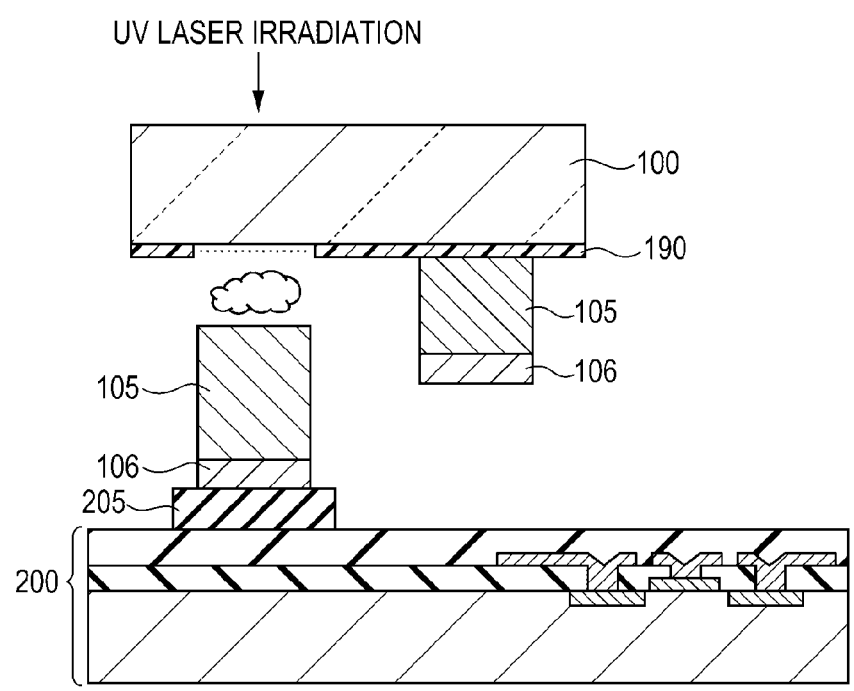
FIG. 20 is a cross-sectional view illustrating a step of selectively transferring the functional region according to the fifth embodiment.

In this embodiment, as illustrated in FIG. 19, the first substrate 103 is bonded to the second substrate 100 with the resist 107 provided therebetween. In this case, a layer 190 composed of a spin-on polymer, polymethyl methacrylate (PMMA), PMER, polyimide, or benzocyclobutene (BCB) may be provided between the resist 107 and the second substrate 100, thereby increasing adhesion strength. The etching sacrificial layers 105 of a composite member illustrated in FIG. 19 are etched by being brought into contact with the etching solution through a groove or hole formed in the second substrate 100, thereby separating the first substrate 103. Subsequently, the selective transfer of the functional regions onto another substrate is performed in the same way as in the foregoing embodiments. In this embodiment, conditions for altering the structure of the resist 107 into a separable state (for example, the resist temperature, the wavelength and power of irradiation light, and the thickness of a portion of the resist where the structure will be changed) may be specified within a certain range. To that end, the separable resist structure (e.g., the thickness, the size of bubbles generated by altering the structure, the thickness of a shell, diameters of pores, and density) may be determined. With respect to a resist material or the like, a local reaction to treatment may be facilitated by a method. Examples of the method include a method in which a laser-light absorber is added to the resist; a method in which the wavelength of irradiation light is selected; a method in which an auxiliary layer having wavelength selectivity is arranged; and a method in which an inorganic layer is arranged on the resist. The resist can be separated by carbonization at, for example, 300 degrees (Celsius). The resist can be separated using an ozone asher at 120 degrees (Celsius). When a resist is irradiated with UV-laser light, a region of the resist irradiated with UV-laser light begins to decompose. Nitrogen gas is evolved. The resist foams to increase the thickness by several tens to a hundred times. The region of the resist irradiated with UV-laser light has a kind of porous structure and a reduced mechanical strength, so that the region is brittle. Thus, breaking the brittle region separates the functional region from the glass substrate.

In the transfer method described above, in the case of producing, for example, an LED, it is possible to form a compound semiconductor multilayer film described below. A p-AlAs layer (etching sacrificial layer) is formed on a p-type GaAs substrate (seed substrate). As the compound semiconductor multilayer film, the following layers are formed thereon. A p-type GaAs contact layer, a p-type AlGaAs cladding layer, a p-type AlGaAs active layer, an n-type AlGaAs cladding layer, and an n-type GaAs contact layer are formed. An AlInGaP layer may be formed as an etch stop layer between the sacrificial layer and the compound semiconductor substrate. In the case of etching the GaAs layer and the AlGaAs layer with sulfuric acid, etching is stopped at the AlInGaP layer. Then the AlInGaP layer is removed with hydrochloric acid. in the case of etching the GaAs layer and the AlGaAs layer with a mixture of ammonia and hydrogen peroxide, an AlAs layer may be used as a stop layer.

As a material for the compound semiconductor multilayer film, compound semiconductor material systems other than GaAs may be used, Examples thereof include AlGaInP systems, InGaAsP systems, GaN systems, AlGaN systems; and InAlGaN systems. At least one of a metal film and a DBR mirror may be arranged on the compound semiconductor multilayer film. The term "metal film" used here indicates a film formed of a metal composed of, for example, Au, Ti, or Al. A material for the metal film may be selected in accordance with the emission wavelength of the LED. For example, in the case of producing a red LED that emits light with a wavelength of 700 to 800 nm, Au, Ag, or the like has a high reflectance. For a blue LED that emits light with a wavelength of about 360 nm, Al may be used. For example, in the case of a GaAs-based compound semiconductor, the term "DBR mirror" (distributed Bragg reflector) indicates a laminate including AlAs layers and AlGaAs layers alternately stacked; or a laminate including Al oxide layers and $Al_{0.2}Ga_{0.8}As$ layers alternately stacked. It is difficult to form aluminum oxide by epitaxial growth. Thus, in fact, $Al_xGa_{1-x}As$ is used, and the refractive index may be controlled by changing the value of x between 0.2 and 0.8.

Furthermore, an LED element is formed using the compound semiconductor multilayer film, a homojunction LED may be formed in place of a heterojunction LED. In this case, after each layer is epitaxially grown, impurity diffusion is performed by a solid-phase diffusion method, forming a PN junction in the active layer. Each of the contact layers may have a higher impurity concentration than the cladding layers that sandwich the active layer in order to form an ohmic contact with a corresponding one of electrodes arranged on the p-type side and the n-type side.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-213132, filed Sep. 15, 2009, which is hereby incorporated by reference herein in its entirety.

INDUSTRIAL APPLICABILITY

Aspects of the present invention may be applied to the manufacture of display apparatuses such as displays and array devices in which semiconductor elements are formed in arrays on semiconductor substrates, in particular, LED printers including LED elements formed on semiconductor substrates, optical transmitter receiver elements, and photodetectors. In the case where aspects of the present invention is applied to photodetectors, scanners may be made.

REFERENCE SIGNS LIST

100 Second substrate
101, 102 Functional region (first functional region, second functional region)
103 First substrate (seed substrate)
105 Separation layer (etching sacrificial layer)
106 Compound semiconductor multilayer film (functional region)
107 Resist
200 Third substrate
300 Fourth substrate
115, 155 dry film resist (DFR)

The invention claimed is:

1. A method for transferring at least part of a functional region arranged on a separation layer on a first substrate onto a second substrate, the separation layer being capable of being brought into a separable state by treatment, the method comprising:
    a forming step of forming a dry film resist on the at least part of the functional region;
    an exposure step of exposing at least part of the dry film resist so as to form an underexposed portion in a surface layer due to an exposure of the surface layer to an oxygen atmosphere;
    a first bonding step of bonding the first substrate to the second substrate such that the surface layer of the dry film resist contacts the second substrate and a developing step of developing the exposed dry film resist by feeding a first developing solution through separation grooves formed through the second substrate, wherein the underexposed portion is sufficiently resistant to the first developing solution.

2. The method according to claim 1, further comprising:
    a first separation step of separating the first substrate from the second substrate at the separation layer by feeding a second developing solution through the separation grooves;
    after the first separation step, a second bonding step of bonding a transfer region of a third substrate to at least part of the functional region that has been transferred to the second substrate; and
    a second separation step of separating the second substrate from the third substrate at a predetermined portion of the dry film resist by irradiating the predetermined portion of the dry film resist with light having a predetermined wavelength from the second substrate side.

3. The method according to claim 1, wherein the second substrate is formed of substrate segments, in the first bonding step, the plural substrate segments are arranged on the dry film resist or the resist so as to be separated from each other.

4. The method according to claim 1, wherein the functional region is previously patterned to the forming step.

* * * * *